United States Patent
Suzuki et al.

(10) Patent No.: US 10,296,267 B2
(45) Date of Patent: *May 21, 2019

(54) INFORMATION PROCESSING APPARATUS, INFORMATION PROCESSING METHOD, AND STORAGE MEDIUM

(71) Applicant: CANON KABUSHIKI KAISHA, Tokyo (JP)

(72) Inventors: Tomohiro Suzuki, Tokyo (JP); Naoki Sumi, Kawasaki (JP); Kiyoshi Umeda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/726,932

(22) Filed: Oct. 6, 2017

(65) Prior Publication Data

US 2018/0039455 A1     Feb. 8, 2018

Related U.S. Application Data

(63) Continuation of application No. 14/727,182, filed on Jun. 1, 2015, now Pat. No. 9,817,614.

(30) Foreign Application Priority Data

Jun. 13, 2014   (JP) .................................. 2014-122749
May 29, 2015   (JP) .................................. 2015-110261

(51) Int. Cl.
*G06F 3/12*     (2006.01)
*G06F 9/44*     (2018.01)
(Continued)

(52) U.S. Cl.
CPC .......... *G06F 3/1206* (2013.01); *G06F 3/1214* (2013.01); *G06F 3/1247* (2013.01);
(Continued)

(58) Field of Classification Search
None
See application file for complete search history.

(56) References Cited

U.S. PATENT DOCUMENTS 6,028,679 A     2/2000   Murphy
7,978,909 B2    7/2011   Umeda
(Continued)

FOREIGN PATENT DOCUMENTS

JP    2006350557 A    12/2006
JP    2010010938 A     1/2010
(Continued)

*Primary Examiner* — Huo Long Chen
(74) *Attorney, Agent, or Firm* — Venable LLP

(57) ABSTRACT

According to an embodiment of this invention, an information processing apparatus that executes, by a processor, a program including a first program layer with an instruction set to be interpreted and executed by the processor and a second program layer with an instruction set interpreted in advance by a unit other than the processor has the following arrangement. That is, the first program layer holds image data to be processed in a first format. On the other hand, the second program layer holds it in a second format. When transferring image data between the first program layer and the second program layer, the format of the image data is converted between the first format and the second format.

17 Claims, 23 Drawing Sheets

(51) Int. Cl.
  *G06F 9/455* (2018.01)
  *G06F 9/54* (2006.01)
  *H03M 7/14* (2006.01)
  *G06F 9/451* (2018.01)
  *G06F 9/448* (2018.01)

(52) U.S. Cl.
  CPC .............. *G06F 3/1292* (2013.01); *G06F 9/44* (2013.01); *G06F 9/45529* (2013.01); *G06F 9/54* (2013.01); *H03M 7/14* (2013.01); *G06F 9/4484* (2018.02); *G06F 9/451* (2018.02)

(56) References Cited

U.S. PATENT DOCUMENTS

| | | |
|---|---|---|
| 8,374,439 B2 | 2/2013 | Hori |
| 8,873,090 B2 | 10/2014 | Nakagawa |
| 9,465,571 B2 | 10/2016 | Kato et al. |
| 9,582,232 B2 | 2/2017 | Umeda et al. |
| 9,671,981 B2 | 6/2017 | Kunieda et al. |
| 9,678,700 B2 | 6/2017 | Goto et al. |
| 9,817,614 B2* | 11/2017 | Suzuki .................. G06F 3/1206 |
| 2002/0051164 A1* | 5/2002 | Watanabe ............... G06Q 30/06 |
| | | 358/1.13 |
| 2002/0174186 A1 | 11/2002 | Hashimoto et al. |
| 2003/0005050 A1 | 1/2003 | Pineau et al. |
| 2006/0008114 A1* | 1/2006 | Sekiguchi .......... G06K 9/00456 |
| | | 382/100 |
| 2006/0101334 A1 | 5/2006 | Liao et al. |
| 2006/0251455 A1 | 11/2006 | Kim et al. |
| 2010/0053677 A1 | 3/2010 | Kudo |
| 2010/0303351 A1 | 12/2010 | Umeda et al. |
| 2011/0007346 A1* | 1/2011 | Bush, III .............. G06F 3/1219 |
| | | 358/1.15 |
| 2012/0224227 A1* | 9/2012 | Kukino .................. H04N 1/387 |
| | | 358/3.06 |
| 2013/0124715 A1* | 5/2013 | Averbuch ................ H04L 67/34 |
| | | 709/224 |
| 2013/0128306 A1 | 5/2013 | Takahashi |
| 2014/0026023 A1 | 1/2014 | Cabanier |
| 2014/0043343 A1 | 2/2014 | Iwai et al. |
| 2014/0049790 A1* | 2/2014 | Nakamura ............ G06F 3/1298 |
| | | 358/1.13 |
| 2015/0095643 A1 | 4/2015 | Adams |
| 2015/0301721 A1* | 10/2015 | Clark ...................... H04L 67/10 |
| | | 715/780 |
| 2015/0363173 A1 | 12/2015 | Kurokawa et al. |
| 2015/0365546 A1 | 12/2015 | Umeda et al. |
| 2015/0378643 A1 | 12/2015 | Sumi et al. |
| 2015/0379382 A1 | 12/2015 | Mizoguchi et al. |
| 2015/0379741 A1 | 12/2015 | Obayashi et al. |

FOREIGN PATENT DOCUMENTS

| | | |
|---|---|---|
| JP | 2010278708 A | 12/2010 |
| JP | 2011233034 A | 11/2011 |

* cited by examiner

F I G. 15
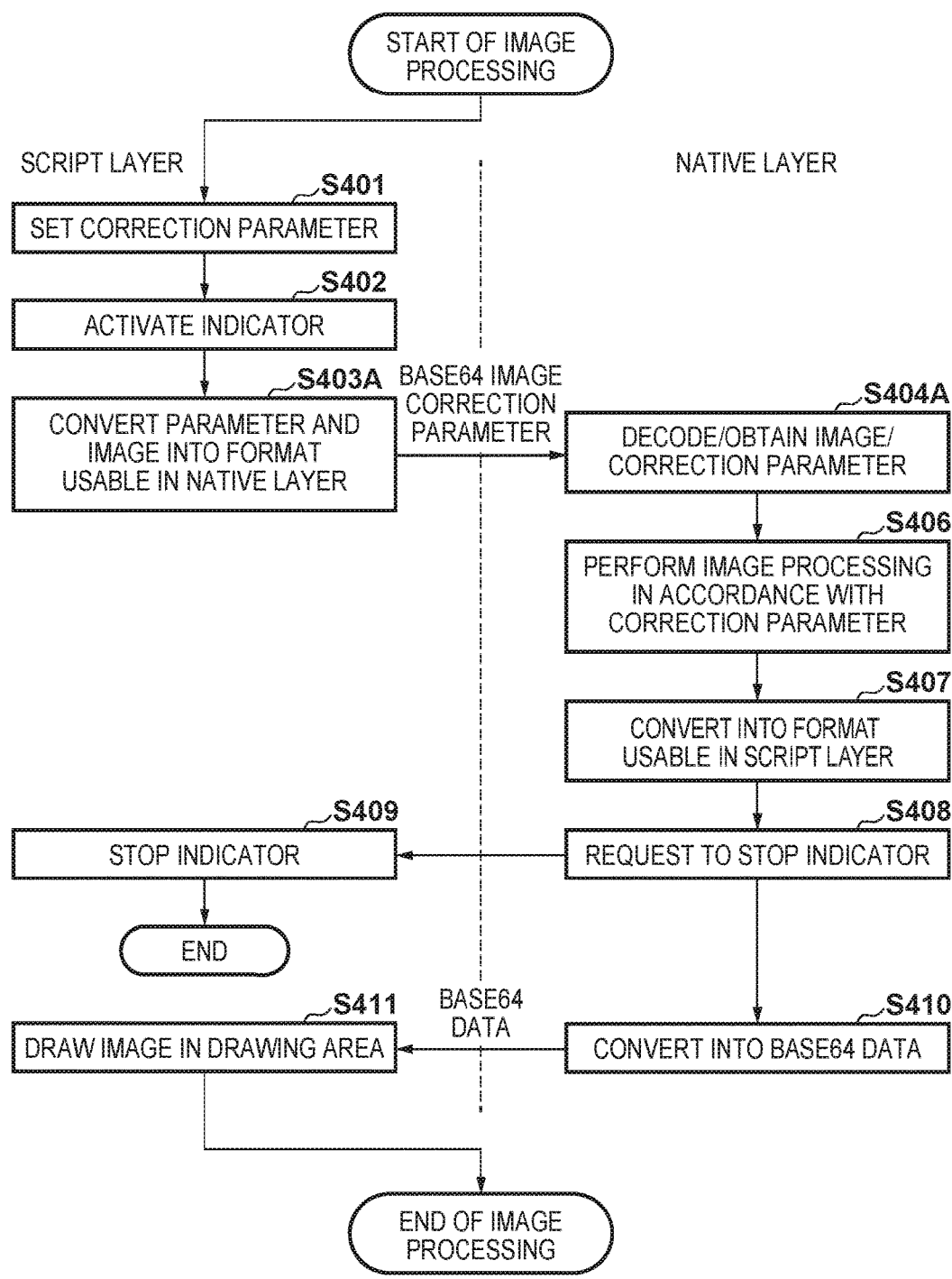

INFORMATION PROCESSING APPARATUS, INFORMATION PROCESSING METHOD, AND STORAGE MEDIUM

CROSS-REFERENCE TO RELATED APPLICATION

This application is a continuation of U.S. patent application Ser. No. 14/727,182, filed Jun. 1, 2015, which is herein incorporated by reference.

BACKGROUND OF THE INVENTION

Field of the Invention

The present invention relates to processing executed by an information processing apparatus such as a mobile terminal that operates as an external device for an image output apparatus, for example, a printer.

Description of the Related Art

In recent years, multi-function mobile terminals (to be referred to as mobile computers hereinafter) incorporating a camera function have explosively become widespread, and far surpass digital cameras and conventional personal computers (to be referred to as PCs hereinafter) in sales. Such mobile computer integrates a high-resolution camera whose number of pixels ranges from 8 millions to 20 millions. Such high-resolution camera contributes to effectively using a modern printer. The recent inkjet printer has a printhead with an ultra-high nozzle resolution. To effectively use the printhead, for example, when printing an image on an A4-sized printing medium, image data containing several tens of millions pixels is required. Thus, the use of the high-resolution camera leads to improvement of print quality.

Such mobile computer is basically formed from three elements, that is, hardware as the computer itself, an operating system (to be referred to as an OS hereinafter) operating on the hardware, and an application operating on the OS. By using the application, the user can use a function such as a map, mail, or browsing of a Web site on the Internet.

As examples of the form of such application operating on the mobile computer, there are mainly two application forms, that is, a native application and Web application. The features of each application form will be explained below.

The native application is developed by using a development environment and development language which are prepared for each OS. For example, the C/C++ language is used on an OS provided by company A, the Java® language is used on an OS provided by company B, and a different development language is used on an OS provided by company C. In general, the native application is compiled in advance in each development environment, and converted from a so-called high-level language understandable by a human into instruction sets such as an assembler interpretable by the CPU of the computer. Thus, the ordinary native application has an advantage that it is possible to perform an operation at high speed since the CPU directly interprets instructions.

On the other hand, the Web application indicates an application operating on a Web browser which is normally incorporated in an OS on each computer in recent years. The application is generally developed by using a language such as HTML5, CSS, or JavaScript® so that the Web browser can interpret the application. These languages are Web standard languages. Therefore, if a Web application is described using the Web standard language, it can operate in any environment where the Web browser operates.

The above-described recent mobile computer integrates a high-resolution camera. The mobile computer is carried by the user daily and also includes a memory capable of storing thousands of photos. Hence, the user can easily enjoy photo taking at a very high frequency. Image processing to, for example, apply filtering for adding monochrome/sepia-toning to a photo image obtained in this way or correct undesirable conditions such as excessive darkness or loss of color balance in a photo is a very important and indispensable function for the user. When developing an application that allows the user to easily execute such image processing without any stress in the two forms described above, the following problems arise.

A native application can execute processing at a high speed, as described above. However, since the native application needs to be developed individually in a development language that changes between OSs, the development cost and development time increase. In addition, the native application needs to be compiled in advance. For this reason, it is difficult to change the UI design of the application at the time of operation or dynamically enhance functions.

Japanese Patent Laid-Open No. 2011-233034 discloses an example of a web application form. In a web application, normally, the main body of the application described in HTML5, CSS or JavaScript® exists on a server outside the mobile computer. Since the application is dynamically downloaded from the server to the mobile computer via the Internet for utilization, the UI design and the like can dynamically be updated without being compiled in advance. However, when executing advanced complex processing, there are only two options for the web application. That is, the web application is executed on the browser by JavaScript® because of restrictions of the browser in terms of security, or executed on the server. JavaScript® is conventionally described as a script of a character string visually recognizable by a human, and can be executed by compiling the script as needed at the time of operation. For this reason, if complex processing is described using JavaScript®, the operation is slow.

If the web application is built so as to execute the processing on the server, time is needed to upload data of a photo or the like existing in the mobile computer to the server via the Internet and download the processing result. This is a large problem for the user who wishes the mobile application to perform stress-free instantaneous processing. In addition, processing on the server cannot be executed offline.

In a case where image data representing an image containing, for example, 2-3 millions of pixels undergoes image processing for displaying the image on a screen on the mobile computer, the above two problems in the web application can be minimized. However, in a case where image data is processed for printing by a printer, image data representing an image containing several tens of millions of pixels has to be handled. This results in negatively affecting user-friendly operation.

To solve the above problem, a unique software structure, so called "a hybrid application" has been recently proposed. As one example of the software structure, Cordova® is known as one of open source software. This hybrid application has a configuration in which the above-mentioned web application (script layer) and a native application (native layer) coexist. An application UI (user interface) is described by using a web standard language (e.g. HTML5, Javascript®), similar to the web application. On the other hand, an operation part of the application is described by C/C++ language, and complied in advance for each OS in each CPU. Since these two layers coexist in a single application, a bind function is provided to invoke various functions in the native layer from the script layer. This enables the application UI in the hybrid application to be described independent of an OS and invoke various functions of the native layer. Thus, the hybrid application can execute a complicated process at high speed.

As described above, the hybrid application has a configuration in which an advantage of a web application and that of a native application are combined. However, if such application structure is applied to development of an image processing and print application, the following problem arises. To explain the problem, a case where a native layer opens image data stored in a mobile terminal and displays an image based on the image data on an application UI of a script layer is considered.

In this case, the native layer holds the image data in form of RGB signals (i.e. in a binary format) in a memory, while the script layer holds the image data in form of character strings such as base64 due to restriction of the used language. In other words, these layers hold the image data in the respective formats. Thus, without data conversion, both layers cannot share the image data. Without sharing the image data, an image-processed result by the native layer at high speed cannot be previewed by the UI part of the script layer.

Further, in the print application, it is necessary for the mobile terminal to obtain information on a paper sheet available in the printer and display the information on the UI so that a user can select his/her intended paper. However, such processing is not provided in the above-mentioned Cordova®, and none of the prior arts has proposed any specific solution. Furthermore, it is necessary for a user to perform print settings such as double-sided/single-sided and monochrome/color. However, none of the prior arts has proposed any specific method as to how such information is transferred from a script layer to a native layer, and to a printer.

Thus, even though a hybrid application is applied, it is still difficult to develop a user-friendly image processing and print application.

To solve the above-described problems, the functions of a native layer may be invoked from a script layer to perform image processing at high speed. However, since the format of image data handled in the native layer and the format of image data handled in the script layer are different, for example, the script layer cannot receive image data that has undergone image processing in the native layer.

SUMMARY OF THE INVENTION

Accordingly, the present invention is conceived as a response to the above-described disadvantages of the conventional art.

For example, an information processing apparatus, an information processing method, and a storage medium according to this invention are capable of receiving/transmitting image data between a native layer and a script layer even upon executing a hybrid application.

According to one aspect of the present invention, there is provided a non-transitory computer readable storage medium which stores a computer program to be executed in a processor of an information processing apparatus, wherein the program includes a first program layer with an instruction set to be interpreted and executed by the processor and a second program layer with an instruction set interpreted in advance by a unit other than the processor, the first program layer holds image data as text data, the second program layer holds image data as binary data, the second program layer converts image data selected in accordance with an instruction received from the first program layer into data in a base64 format, the second program layer transmits the data in the base64 format to the first program layer, the first program layer requests to execute rendering processing for the data in the base64 format, and the first program layer requests a print using an execution result of the requested rendering processing.

According to another aspect of the present invention, there is provided a method of controlling an information processing apparatus capable of executing a program including a first program layer with an instruction set to be interpreted and executed by a processor and a second program layer with an instruction set interpreted in advance by a unit other than the processor, comprising: causing the first program layer to hold image data as text data; causing the second program layer to hold image data as binary data; causing the second program layer to convert image data selected in accordance with an instruction received from the first program layer into data in a base64 format; causing the second program layer to transmit the data in the base64 format to the first program layer; causing the first program layer to request to execute rendering processing for the data in the base64 format; and causing the first program layer to request a print using an execution result of the requested rendering processing.

According to still another aspect of the present invention, there is provided an information processing apparatus capable of executing a program including a first program layer with an instruction set to be interpreted and executed by a processor and a second program layer with an instruction set interpreted in advance by a unit other than the processor, comprising: a holding unit configured to hold image data as text data in the first program layer and as binary data in the second program layer; a conversion unit configured to convert image data selected in accordance with an instruction received from the first program layer into data in a base64 format in the second program layer; a transmission unit configured to transmit the data in the base64 format converted by the conversion unit from the second program layer to the first program layer; a rendering unit configured to execute rendering processing for the data in the base64 format received in the first program layer; and a request unit configured to request a print using an execution result of the requested rendering processing executed by the rendering unit.

The invention is particularly advantageous since when transferring image data between the first program layer and the second program layer, data can be converted into a data format to hold the data in each layer, that is, inter-program layer image data transfer can be performed. This makes it possible to provide a hybrid application compatible with many types of OSs by one-time development. It is also possible to use the functions of a program layer of high execution speed when performing image processing using a hybrid application.

Further features of the present invention will become apparent from the following description of exemplary embodiments (with reference to the attached drawings).

BRIEF DESCRIPTION OF THE DRAWINGS

FIG. 15 is a flowchart illustrating image processing according to the second embodiment.

DESCRIPTION OF THE EMBODIMENTS

Embodiments of the present invention will be described in detail below with reference to the accompanying drawings. Especially in the following embodiment, an arrangement in which a hybrid photo print application (to be described later) is operated on an information processing apparatus, various kinds of image processing are applied to an image selected by the user, and then the image is printed will be explained. Note that typical examples of the information processing apparatus include portable information terminals such as a portable telephone, smartphone, and tablet terminal.

<Description of Hardware Arrangement>

Figure 1:
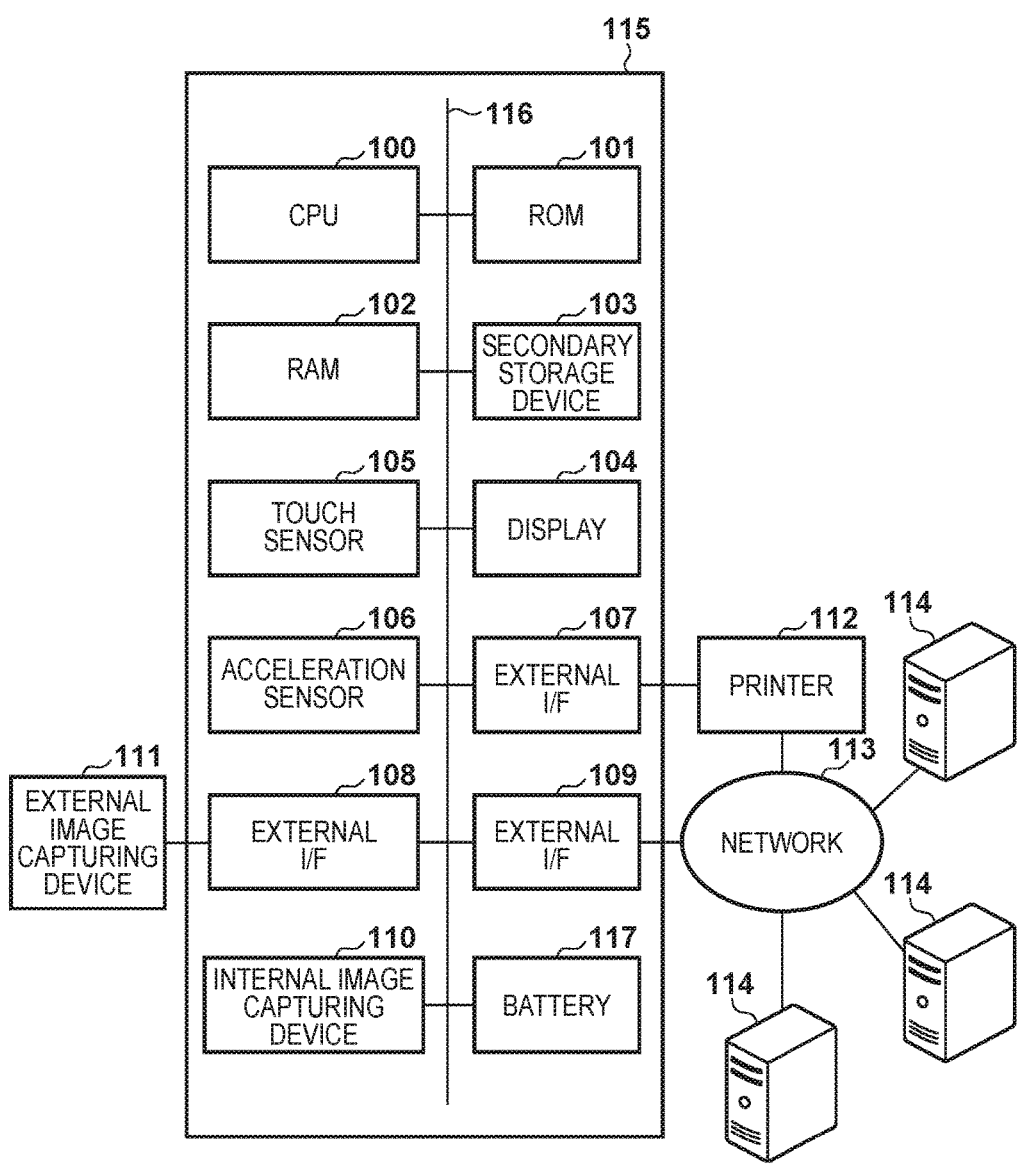
FIG. 1 is a block diagram showing the arrangement of an information processing apparatus according to an exemplary embodiment of the present invention.

FIG. 1 is a block diagram for explaining an example of the arrangement of a portable information terminal such as a smartphone or portable telephone as an information processing apparatus 115 according to an exemplary embodiment of the present invention. Referring to FIG. 1, a CPU (Central Processing Unit/Processor) 100 executes various kinds of processing (to be described below) according to a program. There is one CPU 100 in FIG. 1 but a plurality of CPUs or CPU cores may be included. A ROM 101 stores a program to be executed by the CPU 100. A RAM 102 is a memory for temporarily storing various kinds of information at the time of execution of the program by the CPU 100.

A secondary storage device 103 such as a hard disk or flash memory is a storage medium for storing various programs and data such as files and databases which hold the processing results of image analysis and the like. A display 104 displays a UI (User Interface) for accepting operations for implementing various kinds of processing, and various kinds of information such as the processing result of executed processing. The display 104 may include a touch sensor 105.

The information processing apparatus 115 may include an integrated image capturing device 110. Image data captured by the integrated image capturing device 110 undergoes predetermined image processing, and is then saved in the secondary storage device 103. Image data may be loaded from an external image capturing device 111 connected via an external I/F (interface) 108.

The information processing apparatus 115 includes an external I/F (interface) 109, and can perform communication via a network 113 such as the Internet. The information processing apparatus 115 can obtain, via the communication I/F 109, image data from servers 114 connected to the network 113.

The information processing apparatus 115 includes an acceleration sensor 106, and can obtain acceleration information about the position and attitude of the information processing apparatus 115 itself. The information processing apparatus 115 is connected to a printer 112 via an external I/F 107, and can output data such as image data. The printer 112 is also connected to the network 113, and can transmit/receive image data via the communication I/F 109.

Each of the external I/Fs 107 to 109 is an interface having at least one of a wired communication mode and wireless communication mode, and communicates with an external device (the printer 112 or server 114) in accordance with the communication mode used. For wired communication, for example, USB, Ethernet®, or the like is used. For wireless communication, a wireless LAN, NFC, Bluetooth®, infrared communication, or the like is used. If a wireless LAN is used for wireless communication, there are a mode in which apparatuses are directly connected to each other and a mode in which apparatuses are connected to each other via a relay unit such as a wireless LAN router. Although the external I/Fs 107 to 109 are illustrated separately in this figure, they may be integrally arranged.

A battery 117 supplies power necessary for the operation of the information processing apparatus 115. The various components of the information processing apparatus 115 are interconnected via a control bus/data bus 116, and the CPU 100 controls the various components via the control bus/data bus 116.

Note that in this embodiment, the information processing apparatus 115 serves as the execution location (software execution environment) of software such as a program executed by the control unit (CPU 100) of the information processing apparatus 115.

<Block Diagram of Software>

Figure 2:
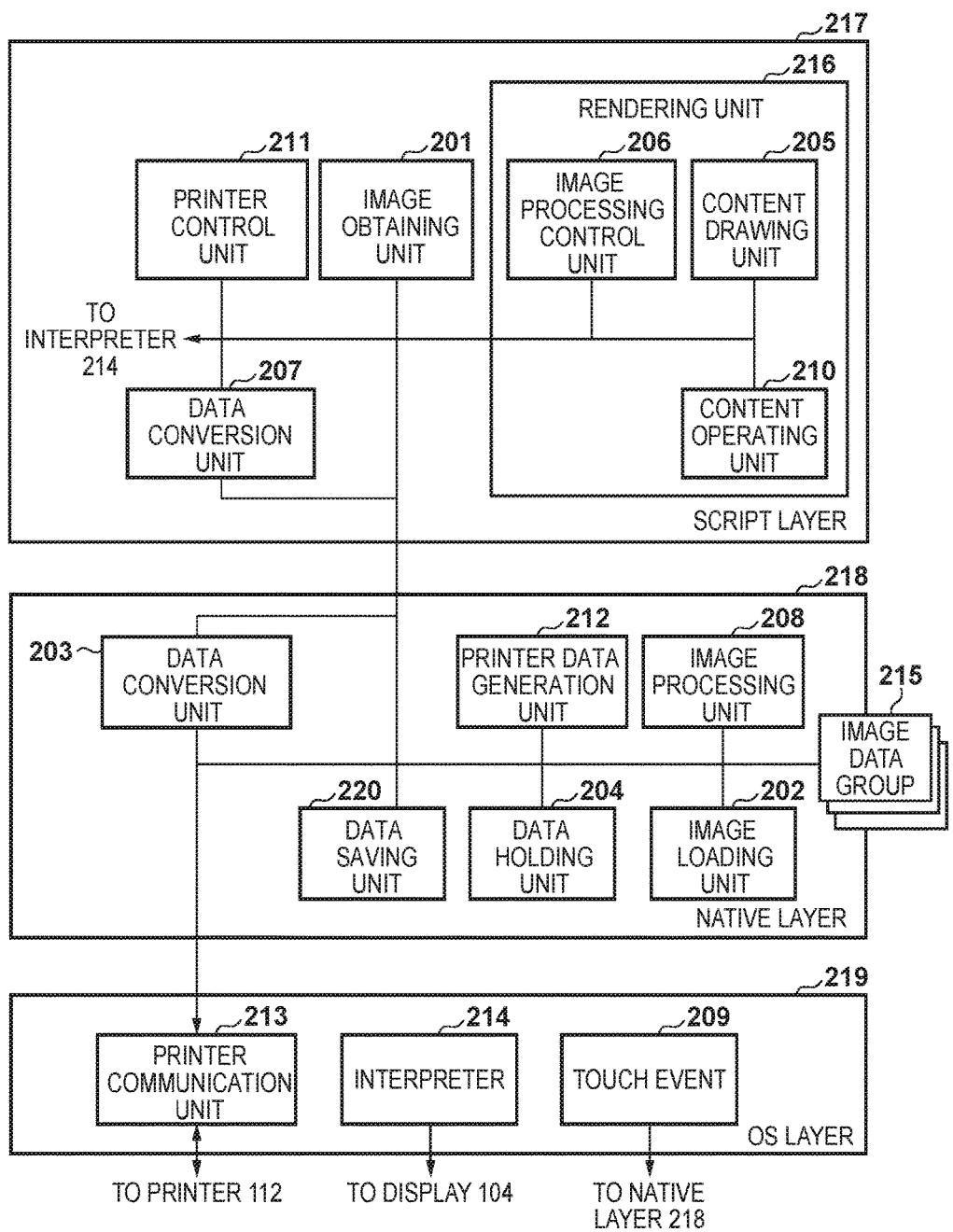
FIG. 2 is a block diagram showing the software arrangement of the information processing apparatus shown in FIG. 1.

FIG. 2 is a block diagram showing the arrangement of software programs operating on the information processing apparatus 115.

The information processing apparatus 115 executes a program of a script layer 217, native layer 218, and OS layer 219. Each layer is implemented when the CPU 100 reads out and executes the corresponding program stored in the ROM 101 or secondary storage device 103.

The script layer 217 is a program layer in which an instruction set (drawing of content, display of an image, replay of a moving image, and the like) is described by text data using a Web standard language such as HTML5, CSS3, or JavaScript®. In the script layer 217, in an application execution environment, various instruction sets of text data are interpreted and executed using a processor (for example, the CPU 100) existing in the application execution environment. In the execution form, for example, there may be a case where instruction sentences are dynamically interpreted line by line every execution operation, a case where instruction sentences are interpreted when activating an application, and a case where instruction sentences are interpreted when installing an application in the information processing apparatus 115.

Processing in the script layer 217 and its contents will be referred to as "script" hereinafter. As an example of a form in which the instructions of the script are interpreted in the information processing apparatus 115, the interpreter function included in the native layer 218 or OS layer 219 is used. Note that in this embodiment, a large portion of the UI of the application is assumed to be described in the script layer 217.

The native layer 218 is a program layer in which an instruction set interpreted (compiled) in advance in an environment other than the application execution environment is described. In the native layer 218, a code described in a high-level language such as C or C++ is compiled in advance on the server or the PC of the developer of the application into an ensemble of instructions interpretable by the CPU 100. Processing in the native layer 218 and its contents, and invocation of the function of the OS layer 219 (to be described later) from the native layer 218 will be referred to as "native" hereinafter. Note that an example of another implementation of the native layer 218 is Java. Java is a high-level language similar to C/C++, and is interpreted in advance into an intermediate code in the development environment at the time of development of the application. The interpreted intermediate code operates in the Java virtual environment of each OS. In this embodiment, such program form is also regarded as a kind of native layer 218.

The OS layer 219 corresponds to the operating system (OS) of the information processing apparatus 115. The OS layer 219 has a unique function and a role of providing the use of the hardware function to the application. The OS layer 219 includes an API. The function of the OS layer 219 can be used from the script layer 217 and native layer 218.

In this embodiment, allowing invocation of the native layer 218 from the script layer 217 will be referred to as "binding" or "bind". The native layer includes an API, and the various functions of the native layer can be used when the script invokes the API. In general, this binding function is normally included in each of various OSs.

Note that in this embodiment, the application including the script layer 217 and native layer 218 will be referred to as a hybrid application. That is, processing of the present application is executed by an information processing apparatus on which a hybrid application and an operating system can operate.

An image obtaining unit 201 of the script layer 217 requests the native layer 218 to obtain image data. At the time of the obtaining request, the image obtaining unit 201 generates a unique ID, and transmits it to the native layer 218. This ID and the image data loaded by an image loading unit 202 of the native layer 218 make a pair, and the pair is stored in a data holding unit 204 of the native layer 218. In addition, for example, a method of designating an absolute path, a method of prompting display of a dialog, or the like can be used.

The image loading unit 202 of the native layer 218 obtains the image data from an image data group 215. A method of obtaining the image data from the image data group 215 depends on the request of the image obtaining unit 201 of the script layer 217. The request method may be selected from a dialog box provided on the UI, or an image may be directly selected based on the path of a file.

A data conversion unit 203 of the native layer 218 converts data in the native layer 218 (e.g. image data of a binary format) into data in a format usable in the script layer 217 (e.g. image data of a text format (base64)). On the other hand, the data conversion unit 203 also converts data (e.g. image data of a text format (base64)) sent from the script layer 217 into data of a format usable in the native layer 218 (e.g. image data of a binary format).

A data conversion unit 207 of the script layer 217 converts data in the script layer 217 (e.g. a processing parameter of a text format) into data in a format usable in the native layer 218 (e.g. a processing parameter of a text format (JSON format)).

The data holding unit 204 of the native layer 218 holds the image data loaded by the image loading unit 202 and image data having undergone image processing by an image processing unit 208. The held image data is rasterized into, for example, an RGB image signal, and has a format in which it is possible to immediately execute image processing.

A content drawing unit 205 of the script layer 217 describes a content to be printed by using a Web standard language. The script operated by a content operating unit 210 is also reflected on the description. The script of the content described by the content drawing unit 205 is interpreted by an interpreter 214 of the OS layer 219, and displayed on the display 104.

An image processing control unit 206 of the native layer 218 determines a correction parameter to be used for image processing and a correction target image. These data are converted in the data conversion unit 207 into a format transmittable to the native layer 218 if required.

The image processing unit 208 of the native layer 218 performs image processing for an image designated by the image processing control unit 206. At this time, image processing to be performed is determined based on the parameter set by the image processing control unit 206. As a method of designating an image, for example, the path of the image is received from the script layer, or whole image data is received.

A touch event 209 of the OS layer 219 obtains information about a touch of the display 104. The information about a touch includes, for example, touch detection of the display 104 and touched position information. The obtained information about a touch is transmitted to the content operating unit 210 of the script layer 217 via the native layer 218.

The content operating unit 210 of the script layer 217 operates the image, for example, enlarges, moves, and rotates the image and changes the script instruction to reflect the operation.

A printer control unit 211 of the script layer 217 controls a rendering start request to a rendering unit 216, a printer detection request, display of a printer setting screen, and generation and transmission of print information. In the printer setting screen, printer settings such as a paper size, paper type, and color/monochrome are made. A printer data generation unit 212 generates printer data based on the items set in the printer setting screen.

Based on the request from the printer control unit 211, the printer data generation unit 212 of the native layer 218 generates a command and data necessary for printer communication. The data necessary for printer communication is data complying with a communication protocol, and the command is data for determining the operation of the printer such as printing or scanning. Thus, the printer data generation unit 212 generates printer data including a command for determining an operation of a printer.

A printer communication unit 213 of the OS layer 219 transmits the printer data received from the printer data generation unit 212 to the connected printer 112, and receives information about the printer 112 from the printer 112. The interpreter 214 of the OS layer 219 interprets/executes an instruction generated in the script layer 217 and described in the Web standard language. For example, an interpretation process of an instruction of drawing an image or the like is executed by the interpreter 214 and displayed on the display 104.

The image data group 215 is an area which holds image data. A data saving unit 220 functions to save image data held in the data holding unit 204 in the image data group 215, as needed.

The rendering unit 216 controls the content drawing unit 205, image processing control unit 206, and content operating unit 210 to render the image data to be processed. This rendering operation includes, for example, causing the interpreter 221 of the script layer 217 to generate an image having an output resolution to the printer 112. At this time, neither the rendering result in the script layer 217 nor the image currently generated by the script layer 217 is displayed on the display 104. The rendering result is transmitted to the data conversion unit 203 of the native layer 218, and converted into image data in a format usable by the printer 112.

<Processing Associated with User Operation>

Figure 3:
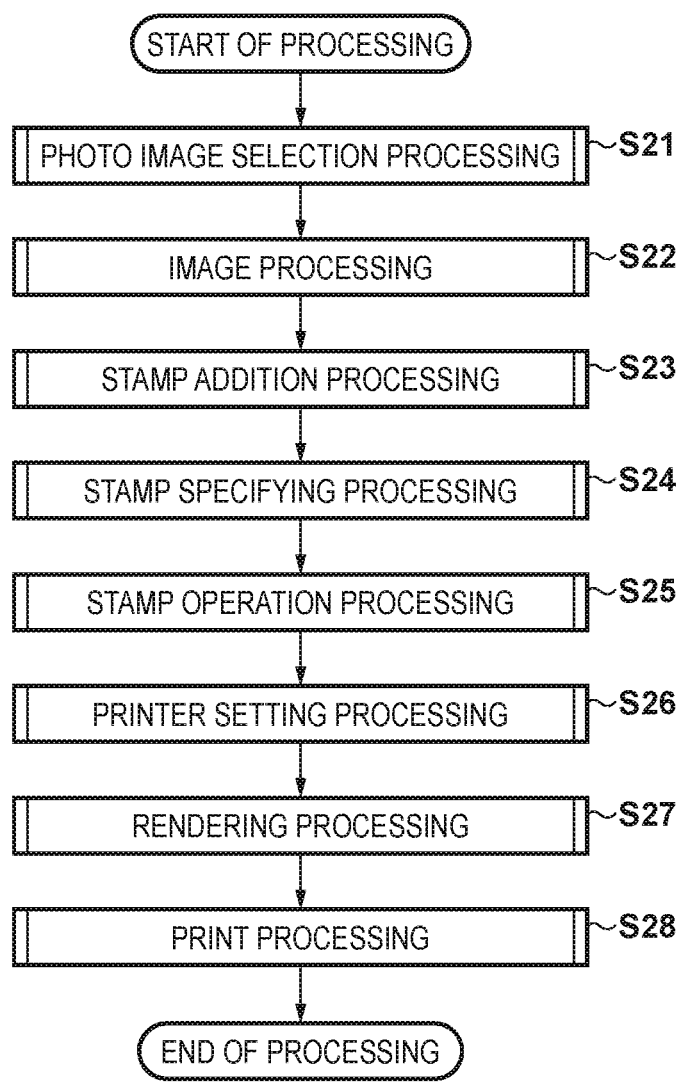
FIG. 3 is a flowchart illustrating processing associated with a user operation.

FIG. 3 is a flowchart illustrating processing including a user operation. An overview of each of processes in steps S21 to S28 will be explained with reference to FIG. 3 and details thereof will be described later. Note that the process of each step shown in the flowchart of the present application is implemented when the CPU 100 of the information processing apparatus 115 executes a program stored in the ROM 101 or secondary storage device 103. Each step shown in FIG. 3 moves according to a user operation on an application screen 1200 as a UI shown in FIG. 12. This application screen 1200 is generated by the script layer 217. An operation on the application screen 1200 is implemented via, for example, the touch sensor 105.

In step S21, upon detecting a user operation (including a touch operation input, the same shall apply hereinafter) on a photo image selection button 1201 of the application screen 1200, the CPU 100 selects a desired image in accordance with the operation. After the image is selected, the CPU 100 displays the selected image on an entire drawing area 1206 of the application screen 1200.

In step S22, upon detecting a user operation on a slide bar 1202 for adjusting the brightness of the displayed image, the CPU 100 sets a correction parameter to be used for image processing in accordance with the user operation. The CPU 100 performs the image processing for the displayed image according to the set correction parameter, and displays processing contents and a processing result in the drawing area 1206.

In step S23, upon detecting a user operation on a stamp addition button 1203, the CPU 100 displays a stamp list. Upon detecting selection of a stamp by a user operation on the stamp list, the CPU 100 adds/displays the selected stamp in the drawing area 1206.

In step S24, the CPU 100 specifies a stamp in accordance with a user operation on the application screen 1200. The stamp specifying operation is performed to determine whether the stamp has been touched, based on coordinates touched by the user operation on the display 104 and the coordinates of the stamp. If the stamp has been touched, the stamp is set in an operation acceptance status. In this example, the stamp is set in the operation acceptance status in response to the user operation. The operation acceptance status will be described later.

In step S25, upon detecting a user operation on a slide bar 1204 for rotating the stamp in the operation acceptance status, the CPU 100 rotates the stamp in the operation acceptance status as a stamp operation in accordance with the user operation.

In step S26, upon detecting a user operation on a print button 1205, the CPU 100 displays a setting screen 1301 (FIG. 13) for setting information necessary for printing. The information necessary for printing includes, for example, a paper size, paper type, print quality, bordered/borderless setting item, as shown in the setting screen 1301 of FIG. 13. In addition, settable setting items such as double-sided/single-sided and monochrome/color are provided depending on the functions of the printer to be used.

In step S27, upon detecting a user operation on a setting completion button 1302 of the setting screen 1301, the CPU 100 executes rendering to convert the image displayed in the drawing area 1206 into a print resolution for output to the printer.

In step S28, the CPU 100 transmits the image converted into the print resolution to the printer 112 together with a printer control command. With the above-described process, the image selected by the user is printed by the printer 112.

Note that the processing shown in FIG. 3 is merely an example. Processing contents are not limited to them, and the processing order of the steps is not limited to this. In this embodiment, the first program layer including an instruction set to be interpreted and executed by the processor is defined as the script layer 217, and the second program layer including an instruction set compiled in advance by a unit other than the processor is defined as the native layer 218. A program including the first program layer and the second program layer implements a hybrid application. Character string data (text data) is defined as the first format and binary data is defined as the second format. Note that the scrip layer 217 can hold data of a text format, while the native layer 218 can hold data of a binary format.

<Details of Photo Image Selection and its Image Processing>

Next, several embodiments on photo image selection and its image processing which are performed in the above-described information processing apparatus will be described. Thus, in these embodiments, the information processing apparatus 115 functions as an image processing apparatus.

<First Embodiment>

Figure 12:
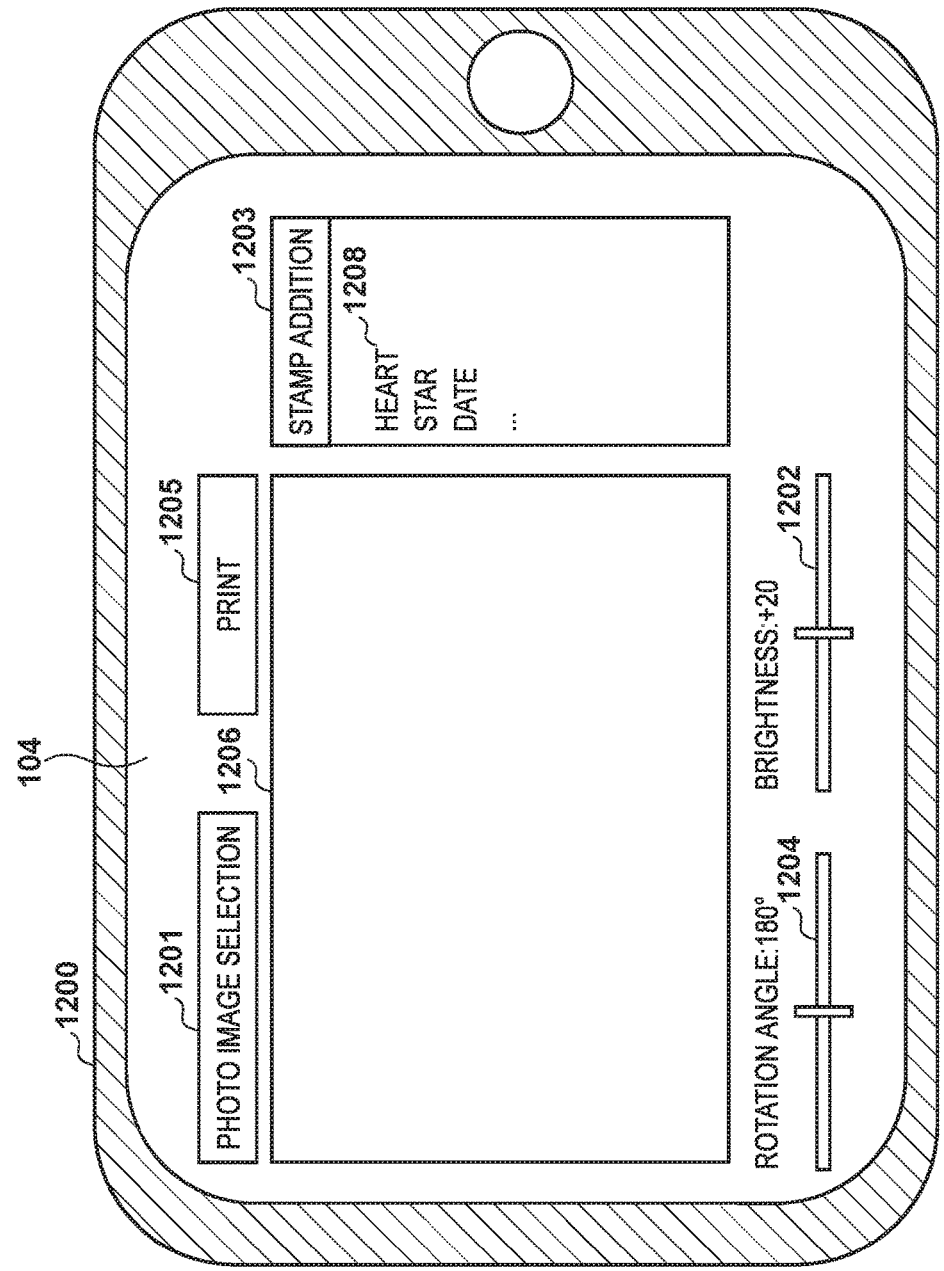
FIG. 12 is a view showing an example of an application screen.

When the user presses the photo image selection button 1201 shown in FIG. 12, step S21 starts. Details of the photo image selection processing in step S21 of FIG. 3 will be described with reference to FIG. 4. Note that steps S301, S302, and S309 to S311 are processes executed by the CPU using the program of the script layer, and steps S303 to S308 are processes executed by the CPU using the program of the native layer.

In step S301, the CPU 100 generates a unique ID. This ID may have any form such as a numerical value or character string as long as it can be transmitted from the script layer 217 to the native layer 218. In step S302, the CPU 100 requests the native layer 218 to select an image in accordance with a user operation on the photo image selection button 1201. In step S302, the ID generated in step S301 is also transmitted to the native layer 218. As a request method, the binding function is used to directly invoke an image selection API unique to the native layer 218 from the script layer 217. However, if the image selection API unique to the native layer cannot directly be invoked, a function capable of being directly invoked from the script layer 217 is prepared in the native layer 218, and a function for invoking the image selection API unique to the native layer is described in the function. This is a method of preparing a wrapper in advance. Also, a mechanism in which the above ID is transferred as an argument is provided in the API. In this way, the ID is transferred to the native layer 218.

In step S303, the CPU 100 displays a device-specific image selection UI on the display 104. Based on a user operation on the displayed image selection UI, one desired image is selected.

In step S304, the CPU 100 obtains the selected image. If, for example, the selected image is in the form of an image file, the CPU 100 opens the file, and reads out its contents. Also, the CPU may download or copy the image file, and open the image file according to a language used in the native layer 218.

In step S305, the CPU 100 rasterizes the obtained image in an RGB space. In this embodiment, the RGB data is held in the native layer 218. However, this invention is not limited to this. For example, the image data can be held in a JPEG (Joint Photography Expert Group) format, PNG (Portable Network Graphics) format, or RGBA format. The RGBA format is a format formed by combining RGB (Red, Green and Blue) components of image data with A (transparency).

In step S306, the CPU 100 holds the rasterized RGB image in the data holding unit 204 in association with the ID obtained from the script layer 217. As an association method, for example, an object having the ID and RGB image is created to make it possible to specify the RGB image by the ID. An association method is not limited to this, and a path as the access destination of the ID and the selected image, a function or class to be executed in accordance with the ID and RGB rasterization, and the like can be used.

In step S307, the CPU 100 converts the rasterized RGB image into image data in a format usable (format supportable) in the script layer 217. In this embodiment, the converted data format is JPEG (Joint Photography Expert Group). A conversion of RGB image data to JPEG data may be performed by using an encoder provided in the OS layer 219. In step S308, the CPU 100 converts the data in the JPEG format into base64 data, and transmits the base64 data to the script layer 217. This is done because the data array of the RGB image cannot be used intact in the script layer 217, and it is thus necessary to convert, in the native layer 218, the data array into a format usable in the script layer 217. Since only a character string can be used in JavaScript®, the base64 format which represents data as a character string is used in this embodiment.

Base64 is an encoding scheme for handling binary data as character string data. Similar to the native layer 218, the script layer 217 can obtain image data and change it. However, while the native layer 218 can hold image data values in a continuous area of the RAM 102 (memory) like a RGB data array, the script layer does not always hold data in a continuous area. Since data holding methods in the script layer 217 and the native layer 218 differ from each other, image data cannot conventionally be transferred as continuous data from the script layer 217 to the native layer 218 at a time. Note that although converted data is merely image data in this embodiment, this invention is not limited to this. GIF (Graphic Interchange Format) data and voice data can also be converted to a base64 format.

However, since character string data is handled as continuous data in the script layer 217 as well, the CPU 100 transmits the continuous data from the script layer 217 to the native layer 218 using the base64 format. In this embodiment, the native layer 218 performs image information conversion processing. That is, character string information received from the script layer 217 is converted into image data, thereby enabling a data operation in the native layer 218. Conversely, when transmitting image data from the native layer 218 to the script layer 217, the image data handled in the native layer 218 is converted into character string information using the base64 method. This makes it possible to transfer image data between the script layer 217 and the native layer 218.

In step S309, the CPU 100 receives the base64 data converted in the native layer 218, and reserves a drawing area for displaying the base64 data in the RAM 102. In this embodiment, as an example of reserving the drawing area, the HTML canvas function is used, and the API of the Context object of a canvas is used to draw an image.

In step S310, the CPU 100 generates and initializes a correction parameter. The correction parameter is an object holding parameters for determining contents of the image processing in step S22. A type of image processing which undergoes in the native layer is determined by the correction parameter. An example of the correction parameter held by JavaScript® is:

```
var CorrectionParam = function( ){
    this.brightness = 10;
}
```

This correction parameter represents that a variable "brightness" is provided for brightness correction in a CorrectionParam object and a value of "10" is stored.

In this embodiment, for the sake of simplicity, the correction parameter only for brightness correction is used. However, parameters (the intensity of a blur filter, ON/OFF of a sepia conversion, and the like) for other correction processes may be added, as a matter of course.

In step S311, the CPU 100 designates base64 data as data to be drawn in the drawing area, thereby drawing an image in the drawing area according to the designation. More specifically, the CPU 100 transmits the base64 data designated in the script layer 217 to the interpreter 214 of the OS layer. The interpreter 214 interprets the script of the base64 data, and displays it as an image in the drawing area. An example of a sample code of reflecting the base64 data on the drawing area is:

```
-------------------------------------------------
var base64Data = base64 data from native layer
var canvas = document.createElement("canvas");
//reserve the drawing area of an image
canvas.setAttribute("width", 100);      //set the
```

-continued

```
size of the drawing area
canvas.setAttribute("height", 100);
var context = canvas.getContext("2d");  //generate an
object having an API to be drawn in the drawing area
var img = new Image( );      //generate an Image object
img.src = base64Data;        //set the received base64
data as the URI of the image
img.onload = function( ){    //start processing after the
end of loading of the image
context.drawImage(img, 0, 0, img.width, img.height, 0,
0, canvas.width,
canvas.height);  //draw the image in the drawing area
using a method of a context object
document.getElementById("div").appendChild(canvas);
//This flowchart assumes a layer structure of many
canvases.
```

These canvases do not freely exist everywhere, and drawing, moving, and enlargement operations are performed within a specific area (the drawing area 1206 of FIG. 12). The area is designated by "div", and each canvas is added to "div".

<Details of Image Processing>

When the user changes the slide bar 1202 shown in FIG. 12, step S22 starts. Details of the image processing in step S22 of FIG. 3 will be described with reference to FIG. 5. Note that steps S401 to S403, S409, and S411 are processes executed by the CPU using the program of the script layer, and steps S404 to S408, and S410 are processes executed by the CPU using the program of the native layer.

In step S401, the CPU 100 sets the correction parameter generated in step S310. In this example, the CPU 100 updates the value of "brightness" of the correction parameter generated in step S310 of FIG. 3 by a value set in accordance with a user operation on the slide bar 1202. In step S402, the CPU 100 activates an indicator, and displays it on the display 104. The indicator is displayed to notify the user that the processing is in progress, and is generally represented by a progress bar, a clock mark, or an image such as blink or rotation of a figure. In step S403, in the script layer 217, the CPU 100 converts the set correction parameter generated in step S401 into a JSON character string format usable in the native layer 218. In this example, the correction parameter is in the form of an object, and cannot be used intact in the native layer 218. Thus, the CPU 100 converts the set correction parameter into a JSON character string. The CPU 100 transfers the correction parameter converted into the JSON character string to the native layer 218 together with the ID generated in step S301 of FIG. 3.

In step S404, the CPU 100 decodes the correction parameter converted into the JSON character string, thereby obtaining the correction parameter. More specifically, the correction parameter is parsed using a parser included in the OS layer 219. In the above example, after the parsing processing, "brightness" of the correction parameter is obtained.

In step S405, the CPU 100 specifies the RGB image rasterized in step S305 of FIG. 3 based on the ID obtained from the script layer 217. Note that association between the ID and the image is not limited to paring the ID and the RGB image, as described above. For example, a method of associating the path of the image with the ID may be used. There are various examples to be associated with the ID, such as an object of the native layer 218, the first address of image data, and a function of invoking the image.

In step S406, the CPU 100 determines image processing to be performed based on the obtained correction parameter, and performs the image processing for the RGB image. In this embodiment, a value of 10 is added to the R, G, and B values. As described above, other information may be added to the correction parameter to increase the types of image processing. For example, known monochrome conversion, known sepia conversion, "ImageFix", "RedeyeFix", "SmartSkin", and the like can also be added.

"ImageFix" is a function (face detection function) of automatically analyzing a photo image using a human face detection or scene analysis unit and performing appropriate brightness/white balance adjustment (see Japanese Patent Laid-Open No. 2010-278708). "RedeyeFix" is a function (red eye detection function) of automatically detecting a red eye image from images and correcting it (see Japanese Patent Laid-Open No. 2006-350557). "SmartSkin" is a function of detecting a human face from a photo image and suitably processing the skin region of the face (see Japanese Patent Laid-Open No. 2010-010938). Note that the types of image processing functions are not limited to these, and various kinds of image processing can be used in accordance with the application and purpose. Additionally, image processing may be done using a function provided by the OS layer 219. In this case as well, the processing arrangement is the same as in this embodiment.

In step S407, the CPU 100 converts the RGB image having undergone the image processing into image data in a format usable (format supportable) in the script layer 217. In this example, the CPU 100 converts the RGB image into data in the JPEG format, similarly to step S307 of FIG. 3. In step S408, the CPU 100 requests the script layer 217 to stop the indicator. This is implemented by invoking an indicator stop function defined in the script layer 217 from the native layer 218.

In step S409, the CPU 100 stops the indicator, and removes the indicator displayed on the display 104.

On the other hand, in step S410, the CPU 100 converts the converted data in the JPEG format into base64 data, and transmits the base64 data to the script layer 217.

In step S411, the CPU 100 receives the base64 data converted in the native layer 218, and draws an image in the drawing area reserved in step S309 of FIG. 3 in accordance with the base64 data. More specifically, the CPU 100 transmits the base64 data designated in the script layer to the interpreter 214 of the OS layer. The interpreter 214 interprets the script of the base64 data and displays it in the drawing area. With the above-described process, the image to which the image processing based on the correction parameter has been applied is displayed.

In this embodiment, image processing is started by a change of the slide bar 1202 as shown in FIG. 12. However, the starting method is not limited to this. For example, a plus button and a minus button may be provided in the screen, and the brightness may be adjusted every time the user presses the buttons. The image processing may be implemented by processing synchronized with a touch event. For example, the brightness is increased by touching the right half of the screen and decreased by touching the left half. Alternatively, a method may be employed which changes only the correction parameter by a user operation, and performing all image processes at once in the native layer upon receiving an image processing execution instruction.

<Details of Stamp Addition Processing>

When the user presses the stamp addition button 1203 shown in FIG. 12, and selects a heart stamp 1208, the process of step S23 starts. Details of the stamp addition processing in step S23 of FIG. 3 will be described with reference to FIG. 6. In the following description, a case in which the heart stamp 1208 is selected after the stamp addition button 1203 of the application screen 1200 shown in FIG. 12 is pressed by a user operation and the stamp list is displayed will be exemplified. Note that steps S501, S502, and S508 to S510 are processes executed by the CPU using the program of the script layer, and steps S503 to S507 are processes executed by the CPU using the program of the native layer.

In step S501, the CPU 100 generates a unique ID. This ID has the same characteristic as that of the ID generated in step S301 of FIG. 3. In step S502, the CPU 100 transmits the access destination (absolute path) of an image to be used as a stamp to the native layer 218 together with the ID generated in step S501, thereby requesting to select the stamp image corresponding to the stamp.

In step S503, the CPU 100 obtains the stamp image using the absolute path of the stamp image received from the script layer 217 and a device-specific image selection API. In step S504, the CPU 100 rasterizes the obtained stamp image into an RGB image. In step S505, the CPU 100 holds the rasterized RGB image in the data holding unit 204 in association with the ID obtained from the script layer 217. An association method is the same as that in step S306 of FIG. 3. In step S506, in the native layer 218, the CPU 100 converts the rasterized RGB image into image data in a format usable (format supportable) in the script layer 217. In this conversion processing, the CPU 100 converts the RGB image into data in the JPEG format, similarly to step S307 of FIG. 3. In step S507, the CPU 100 converts the data in the JPEG format into base64 data, and transmits the base64 data to the script layer 217.

In step S508, the CPU 100 receives the base64 data converted in the native layer 218, and reserves a drawing area for displaying the base64 data in the RAM 102. In step S509, the CPU 100 generates and initializes an object parameter. Note that the object parameter is an object for holding parameters to be used, at the time of the rendering processing (to be described later in detail) in step S27 of FIG. 3, to determine the rotation angle of the stamp after the rendering processing. An example of the object parameter held by JavaScript® is:

```
var ObjectParam = function( ){
    this.theta = 0;
    this.posX = 0;
    this.posY = 0;
    this.width = 100;
    this.height = 100;
}
```

This object parameter represents that a variable name "theta" indicating the rotation angle is provided in an ObjectParam object and a value of "0" is stored in "theta". Similarly, "posX" represents an x-coordinate when the upper left corner of the drawing area is set as a reference point, "posY" represents a y-coordinate when the upper left corner of the drawing area is set as a reference point, "width" represents the lateral width of the drawing area, and "height" represents the longitudinal width of the drawing area. Note that the object parameter is minimized in this embodiment for the sake of simplicity. However, it is apparent that other parameters (translation amount, enlargement magnification, and the like) can be added and used at the time of drawing or rendering.

In step S510, the CPU 100 displays the base64 data as an image in the drawing area 1206 based on the generated object parameter. More specifically, the CPU 100 transmits the base64 data corresponding to the selected stamp to the interpreter 214 of the OS layer. The interpreter 214 interprets the script of the base64 data and displays it in the drawing area as a stamp image. Note that one stamp is selected in this embodiment for the sake of simplicity. However, a plurality of stamps can be selected, as a matter of course. In addition, an image prepared in advance is used as a stamp in this embodiment. However, a method of generating, in the script layer, a drawing product by using a Context object may be used.

<Details of Stamp Specifying Processing>

Figure 7:
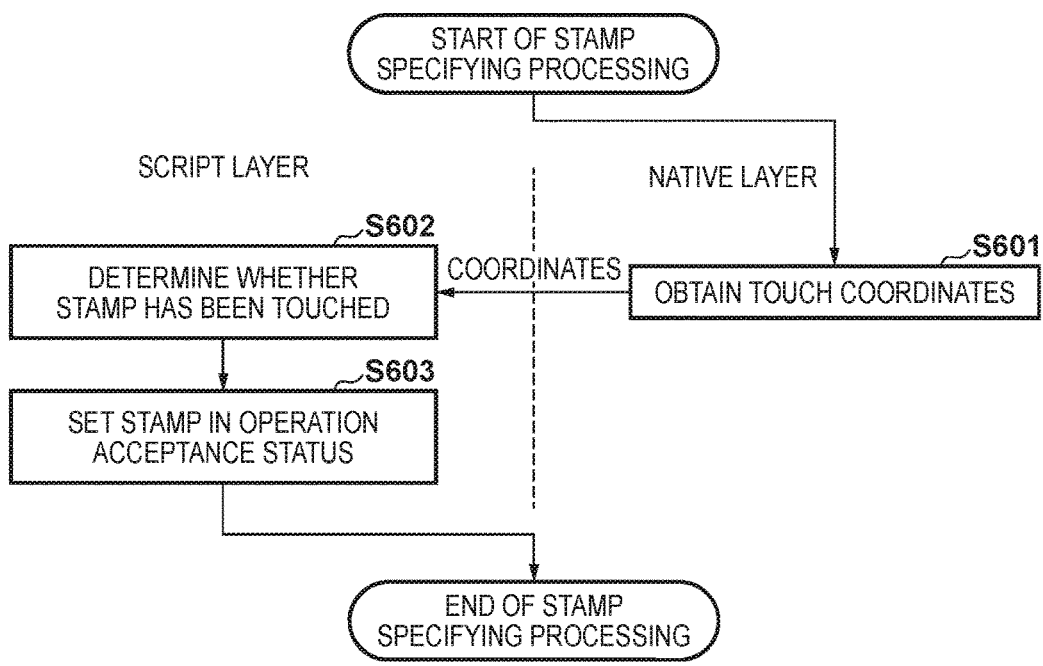
FIG. 7 is a flowchart illustrating details of stamp specifying processing.

When the user touches the display 104 shown in FIG. 1, step S24 starts. Details of the stamp specifying processing in step S24 of FIG. 3 will be described with reference to FIG. 7. Note that steps S602 and S603 are processes executed by the CPU 100 using the program of the script layer 217, and step S601 is a process executed by the CPU 100 using the program of the native layer 218.

In step S601, the CPU 100 obtains coordinates touched on the display 104, and transmits them to the script layer 217.

Figure 5:
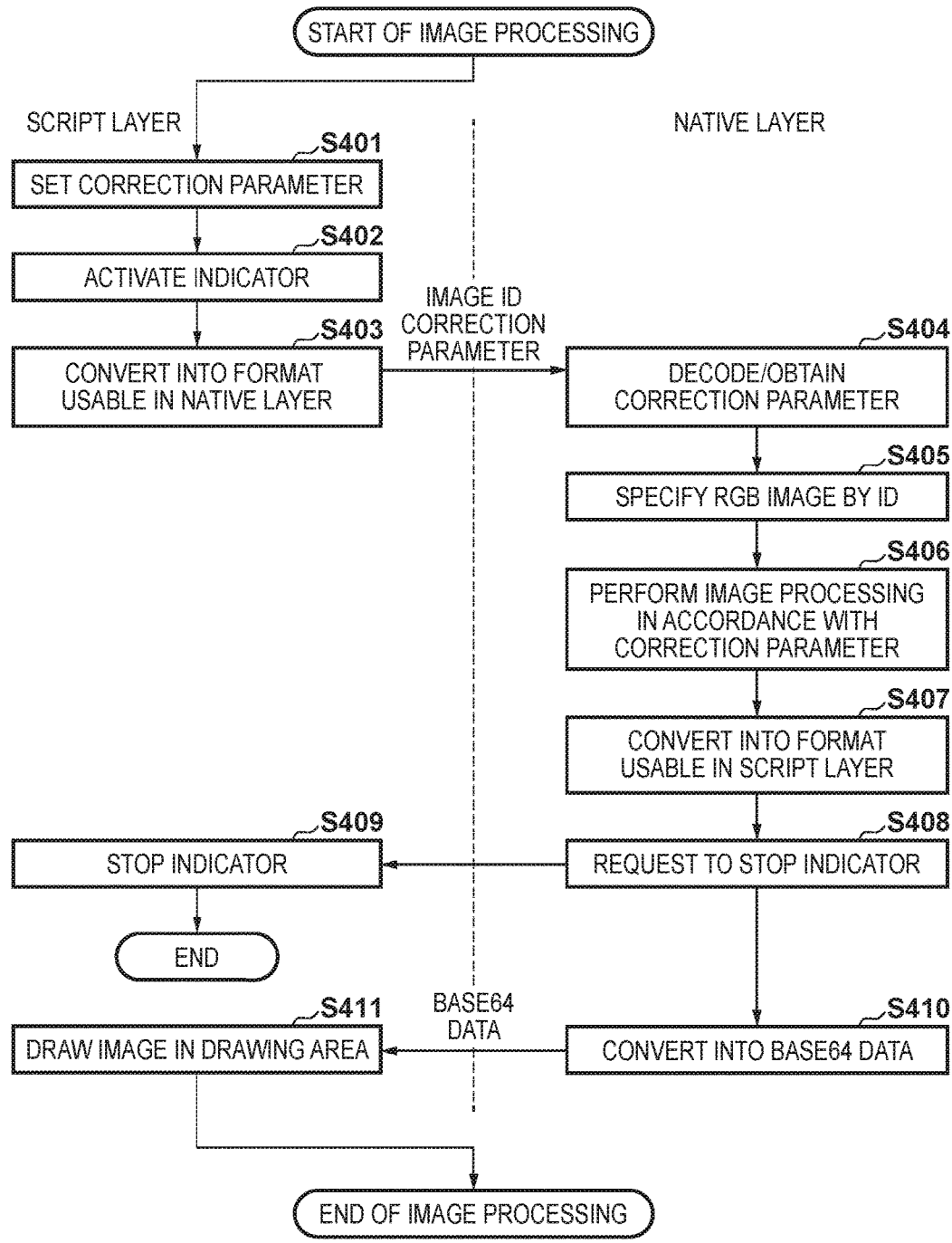
FIG. 5 is a flowchart illustrating details of image processing according to the first embodiment.

In step S602, the CPU 100 determines whether the stamp added in step S23 of FIG. 3 has been touched, based on the coordinates received from the native layer 218 and information of the object parameter generated in step S509 of FIG. 5. In the added stamp, the object parameter includes the initial values. Therefore, according to the above example of the object parameter, the stamp is drawn in an area of 100 in the x direction and 100 in the y direction with reference to (0, 0) set at the upper left corner of the drawing area 1206. If, therefore, a value obtained by subtracting the x-coordinate of the drawing area 1206 from the x-coordinate of the received coordinates (x, y) falls within the range from 0 to 100, and a value obtained by subtracting the y-coordinate of the drawing area 1206 from the y-coordinate of the received coordinates (x, y) falls within the range from 0 to 100, it can be determined that the stamp has been touched. If it is determined that the stamp has been touched, the stamp is set in the operation acceptance status in step S25 of FIG. 3.

The following description will be provided by assuming that the stamp added in step S23 of FIG. 3 has been touched in step S24 of FIG. 3.

In step S603, the CPU 100 sets the stamp in the operation acceptance status in accordance with the determination result. Setting the stamp in the operation acceptance status is equivalent to a state in which when the slide bar 1204 shown in FIG. 12 has changed, an operation according to the change is executed. If the stamp is not set in the operation acceptance status, no change occurs even when the slide bar 1204 is changed. In this embodiment, only the slide bar 1204 configured to rotate a stamp has been mentioned. However, another arrangement of stamp operation may be used, as a matter of course.

<Details of Stamp Operation Processing>

Figure 8:
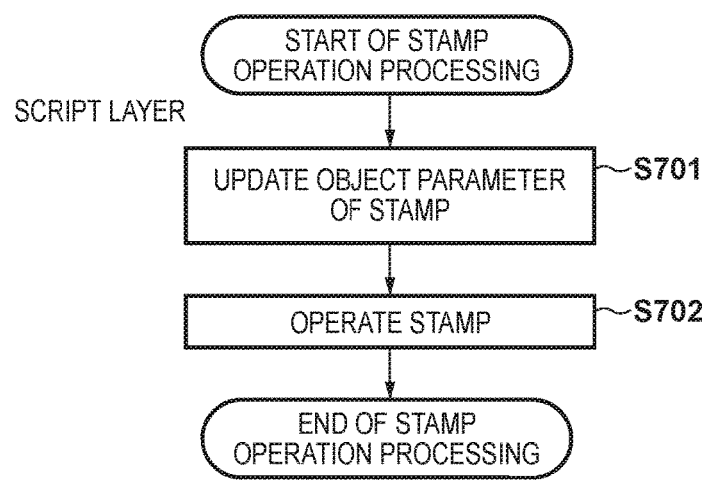
FIG. 8 is a flowchart illustrating details of stamp operation processing.

When the user touches the slide bar of the display 104, step S25 of FIG. 3 starts. Details of the stamp operation processing in step S25 of FIG. 3 will be described with reference to FIG. 8. Note that the steps shown in FIG. 8 are processes executed by the CPU 100 using the program of the script layer 217.

In step S701, the CPU 100 updates the value of "rotate" of the object parameter of the stamp. For example, the CPU 100 updates the value by a value set using the slide bar 1204 of FIG. 12 (180° in FIG. 12). In step S702, the CPU 100 re-draws the stamp set in the operation acceptance status in step S603 of FIG. 7 in the drawing area 1206 by using the object parameter. If, for example, the stamp image is drawn in an HTML canvas, it is possible to rotate the image in the canvas by using the rotate method of the Context object of the canvas.

Note that an operation of the stamp is only rotation in this embodiment. However, other operations such as resizing and translation may be possible, as a matter of course. It is also apparent that if a photo image has an object parameter, the same operation as the stamp operation is possible.

<Details of Printer Setting Processing>

When the user presses the print button 1205 shown in FIG. 12, the process of step S26 of FIG. 3 starts. Details of the printer setting processing in step S26 of FIG. 3 will be described with reference to FIG. 9. Note that steps S801 and S807 to S809 are processes executed by the CPU 100 using the program of the script layer 217, and steps S802 to S806 and S810 are processes executed by the CPU 100 using the program of the native layer 218.

In step S801, from the script layer 217, the CPU 100 requests the native layer 218 to obtain printer information as device information. This is equivalent to a request from the script layer 217 for communicating with the printer 112. As a request method, an API unique to the native layer is invoked from the script layer by using the binding function, similarly to the image selection processing. A function capable of being directly invoked from the script layer 217 or a so-called wrapper of indirectly invoking the function is prepared in advance in the native layer 218. For example, a native function GetPrinterinfo is prepared, and invoked from the script side. In this way, the native layer obtains a request to communicate with an external device from the script layer.

In general, it is impossible to directly communicate with an external device from the script layer 217 under the security restrictions. Therefore, as described above, the script layer 217 requests the native layer 218 to obtain external device information, and then communicates with an external device via the native layer 218. The native layer 218 has a function of communicating with an external device (for example, the printer 112) via the OS layer 219.

In step S802, when the native layer 218 invokes the function, the CPU 100 performs printer detection or so-called discovery. Since a communicable printer is detected, the CPU 100 detects the IP address of the printer that has responded by a method such as broadcast or multicast using a protocol such as Bonjour® and stores it in step S803. For example, a printer connected by the same wireless LAN router is detected.

In step S804, the CPU 100 requests the IP address of the printer that has responded to provide printer information. If a plurality of printers have responded, the CPU 100 requests all printers to provide information. To do this, the CPU 100 generates, in the native layer, a command to obtain the information of each printer. The command is an instruction to designate the operation of the printer, and its example is expressed in XML given by:

```
01:     <?xml version="1.0" encoding="utf-8" ?>
02:     <cmd xmlns:trans="http://www.xxxx/yyyy/">
03:         <contents>
04:             <operation>GetCapability</operation>
05:         </contents>
06:     </cmd>
```

A numerical value such as "01:" written in the left portion of each line is a line number added for the descriptive purpose, and is not described in actual text data in the XML format.

The first line indicates a header representing that the command is described in the XML format.

On the second line, "cmd" indicates the start of the command. A name space is designated by "xmlns" to designate the definition of interpretation of the command. Note that </cmd> on the sixth line indicates the end of the command.

The third line indicates a declaration of describing contents thereafter, and the fifth line indicates the end of the contents.

On the fourth line, an instruction to be requested is described. An actual instruction word exists between <operation> and </operation>. An instruction word "GetCapability" is an instruction of obtaining information of a printer as an external device. For example, it is requested to provide capability information such as a paper type, a size, the presence/absence of a marginless printing function, and the print quality supported by the printer.

Note that a printer information obtaining command may be generated by, for example, loading permanent text stored in advance in the ROM 101. Also, the format is not limited to a text format such as XML, and the command may be described in the binary format, and communicated by a protocol complying with the format. The generated printer information obtaining command is transmitted to the printer 112 via the printer communication unit 213 in a format complying with a communication protocol such as HTTP supported by the printer.

A communication method is not limited to this. Connection using Wi-Fi® Direct, Bluetooth®, infrared communication, telephone line, wired LAN, or USB may be used. By performing communication by a protocol complying with the method, it is possible to obtain the same effects.

Figure 9:
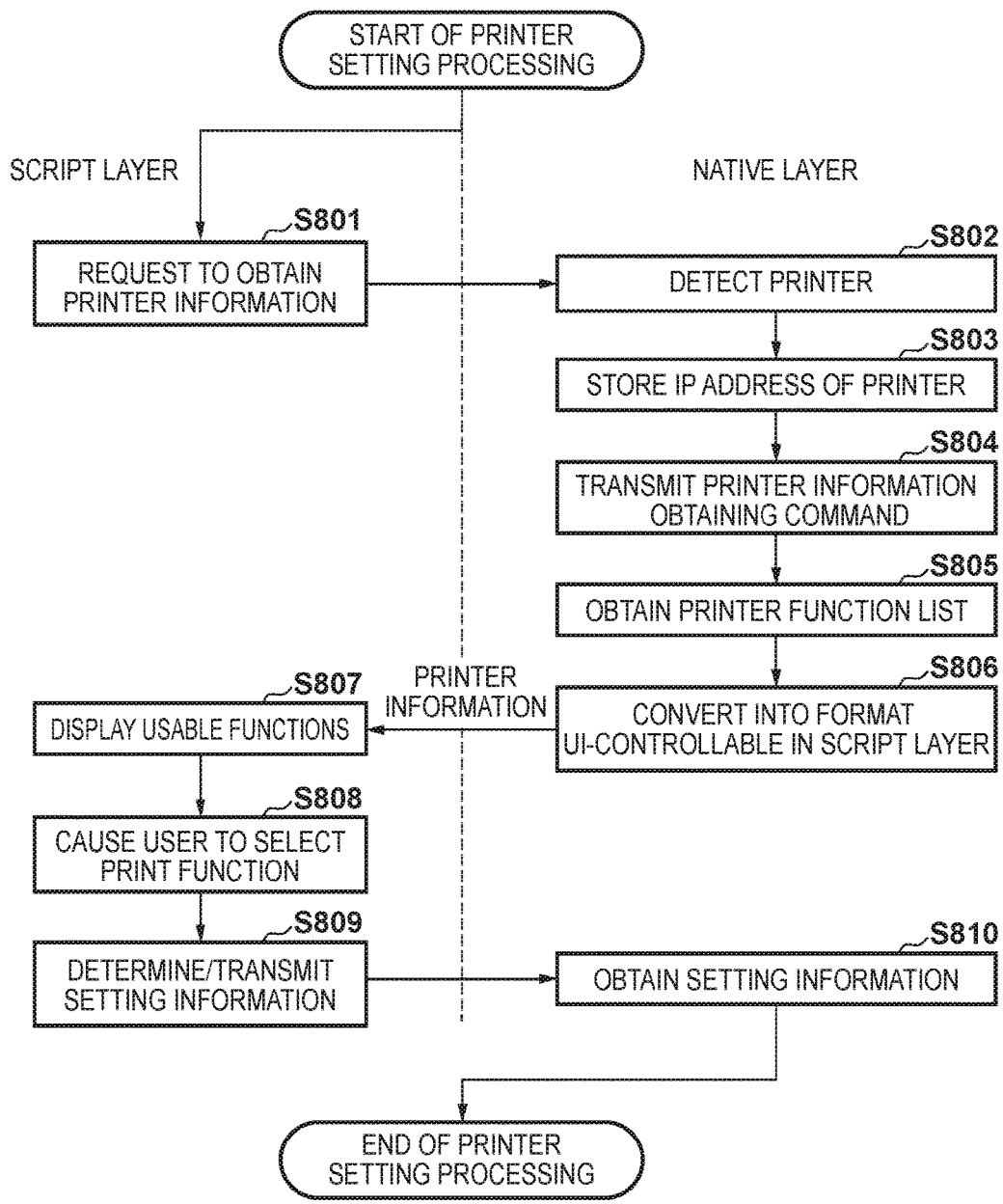
FIG. 9 is a flowchart illustrating details of printer setting processing.

Referring to FIG. 9, a command is generated in the native layer 218. However, even if a command is generated in the script layer 217, it is possible to obtain the same effects. In this case, for example, a command including the above instruction sentence in the XML format is created in the script layer 217, and transferred to the native layer 218. Upon receiving the instruction sentence, the native layer 218 transmits the command to the printer 112 in a format complying with a communication protocol.

Upon receiving the command from the information processing apparatus 115, the printer 112 transmits the printer information as device information in the XML format to the information processing apparatus 115 according to the communication protocol. In step S805, the native layer 218 obtains a printer function from the printer. An example of the printer information is given by:

```
01:     <?xml version="1.0" encoding="utf-8" ?>
02:     <cmd xmlns:trans="http://www.xxxx/yyyy/">
03:         <contents>
04:             <device id="Printer001" />
05:             <mode = 1>
06:                 <media>GlossyPaper</media>
07:                 <size>A4</size>
08:                 <quality>1</quality>
09:                 <border>no</border>
10:             </mode>
11:             <mode = 2>
                 ...
```

-continued

```
    </mode>
        <mode = 3>
        ...
    </mode>
    ...
    </contents>
</cmd>
```

The first line indicates a header representing that the information is described in the XML format. On the second line, "cmd" indicates the start of the command. A name space is designated by "xmlns" to designate the definition of interpretation of the command. Note that </cmd> on the last line indicates the end of the command.

The third line indicates a declaration of describing contents thereafter, and the contents are continuously described up to </contents>. The fourth line indicates a device ID. In this example, the model name of the printer 112 is "Printer001". On the fifth line and subsequent lines, the respective modes of the printer 112 are described. Information in one mode is described between <mode> and </mode>. On the fifth line, the number of a mode is 1. After that, <media> describes the type of printing paper, <size> describes a paper size, <quality> describes the print quality, and <border> describes bordered/borderless information.

On the 11th line and subsequent lines, information about mode 2 as another mode is described. In this way, the model name of the printer 112 and all the modes supported by the printer are described in the XML data. Note that the method of describing printer information is not limited to this. The printer information may be described in another format such as a binary format or a text format which is not a tag format.

In step S805, the CPU 100 receives the printer information from the printer 112. In the native layer, the CPU 100 obtains, from the received printer information, a printer function list including terms of the type and size of printing paper, the print quality, and bordered/borderless and a term count in each of all the modes of the printer 112.

In step S806, the CPU 100 converts the received printer information into a format interpretable in the script layer 217, and transmits the converted information to the script layer 217. That is, the CPU 100 transfers the information obtained by communication with the printer 112 to the script layer 217. More specifically, the printer information can be transmitted in the XML format just as it has been received or transmitted after converted into a text format without tag. Every time a specific native function is invoked from the script layer 217, information may be obtained as its return value. Alternatively, a mode to be obtained or the like may be given to the native function as an argument, and information may be obtains as its return value. In addition, the information may be transferred by using the above-described JSON character string, or transferred by a character string such as base64 by using the data conversion units 207 and 203.

In step S807, the CPU 100 forms a setting screen (FIG. 13) including functions usable by the printer 112 based on the printer information received from the native layer 218, and displays the setting screen. This is called display control in this embodiment. If there are a plurality of connectable printers, a display screen for displaying printer names and prompting the user to select a printer for printing is generated (display contents are controlled). Note that a printer selection method is not limited to this, and a method of selecting a printer which responds earliest, a method of selecting a printer having more functions, a method of selecting a printer with not so many print jobs, or the like may be used.

As described above, the CPU 100 displays the setting screen 1301 (FIG. 13) for prompting the user to select functions usable by the printer, such as the type and size of printing paper, the print quality, and bordered/borderless. As an example of a method of forming a setting screen, a sample of an HTML description is given by:

```
<!DOCTYPE html>
    <head>
        <title>print setting</title>
        <script>
            <!-- paper size -->
            var PaperSizeNum = GetPaperSizeNum( );
            var p = document.getElementById("PaperList");
            var i;
            for(i=0; i<PaperSizeNum; i++){
                p.options[i] = new Option(GetPaperSize(i), GetPaperSize(i));
            }
            <!-- paper type -->
            var MediaTypeNum = GetMediaTypeNum( );
            var m = document.getElementById("MediaList");
            var j;
            for(j=0; j<MediaTypeNum; j++){
                m.options[i] = new Option(GetMediaType(j), GetMediaType(j));
            }
            <!-- print quality -->
            var QualityNum = GetQualityNum( );
            var q = document.getElementById("QualityList");
            var k;
            for(k=0; k< QualityNum; k++){
                q.options[i] = new Option(GetQuality(k), GetQuality(k));
            }
            <!-- bordered/borderless -->
            var BorderNum = GetBorderNum( );
            var b = document.getElementById("BorderList");
            var l;
            for(l=0; l<BorderNum; l++){
                b.options[i] = new Option(GetBorder(l), GetBorder(l));
            }
            <!-- print function -->
            function printer( ) {
                SetPrint(document.getElementById("PaperList").value,
                    document.getElementById("MediaList").value,
                    document.getElementById("QualityList").value,
                    document.getElementById("BorderList").value);
            }
        </script>
    </head>
    <!-- display unit -->
    <body>
        paper size <select id="PaperList"></select><br/>
        paper type <select id="MediaList"></select><br/>
        print quality <select id="QualityList"></select><br/>
        bordered/borderless <select id="BorderList"></select><br/>
        <br/>
        <button id="btn1" onclick="printer( )">setting completion</button>
    </body>
</html>
```

In the above sample, GetPaperSizeNum( ), GetMediaTypeNum( ), GetQualityNum( ), and GetBorderNum( ) are native functions, and each native function has a function of obtaining an item count. For example, paper sizes supported by the printer are A4, A5, B5, and L size, GetPaperSizeNum ( ) returns 4.

Also, GetPaperSize(n), GetMediaType(n), GetQuality(n), and GetBorder(n) are native functions, and each function returns the nth character string corresponding to the argument n. For example, the return value of GetPaperSize(0) as a function of returning text of the paper size is "A4", and the return value of GetPaperSize(1) is "A5". These values are extracted by the native function from the printer information received from the printer.

Note that as an example, the paper size, paper type, print quality, and bordered/borderless settings are made. The present invention, however, is not limited to this. As another example, other setting items such as double-sided/single-sided, color/monochrome, and ON/OFF of image correction are set, as a matter of course.

Figure 13:
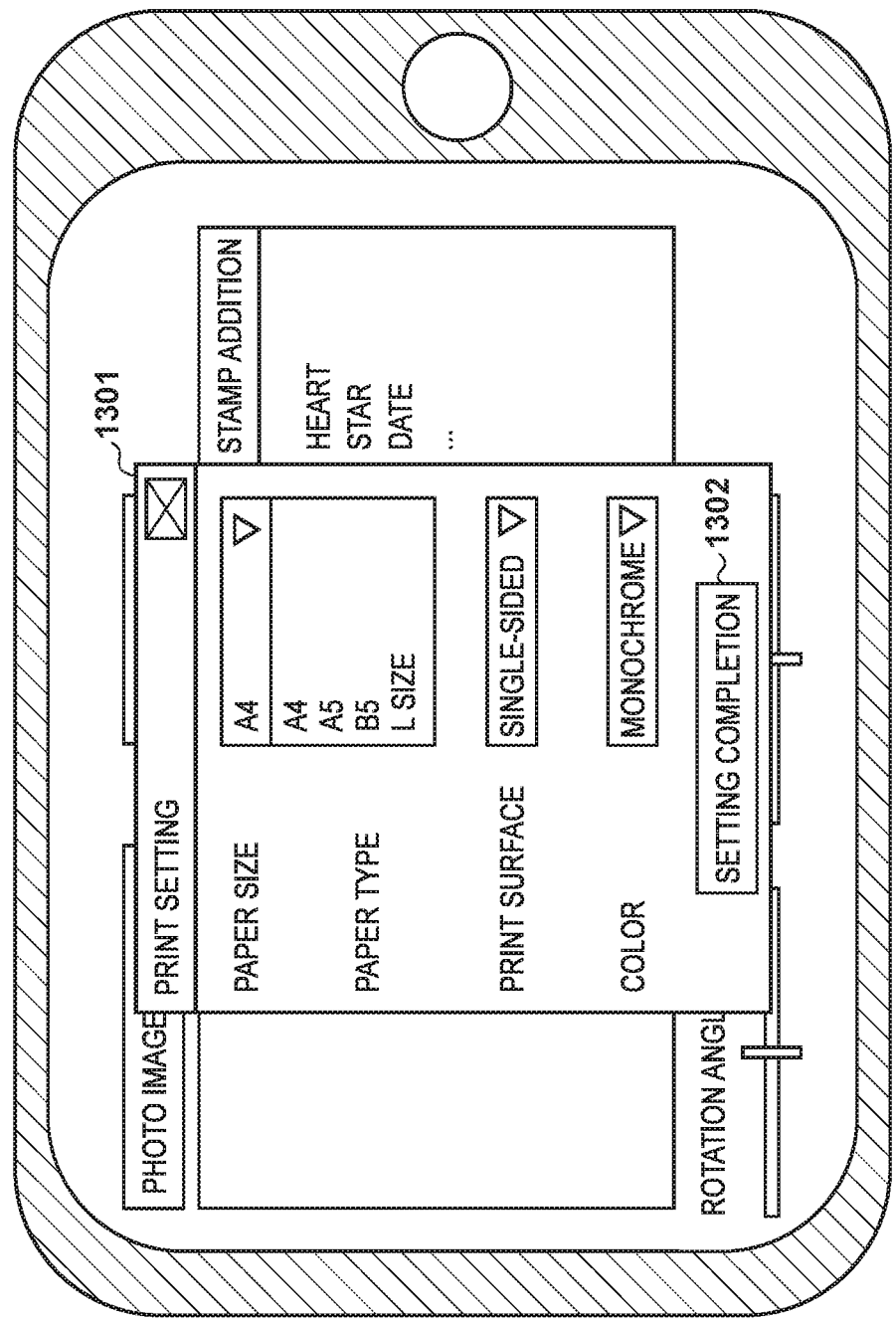
FIG. 13 is a view showing an example of a setting screen.

In step S808, the CPU 100, in the script layer 217, selects a function to be set in the printer based on a user operation on the setting screen 1301. The setting screen 1301 shown in FIG. 13 is an example in which the HTML of the above example is displayed on the display 104 using the rendering unit 216. The printer information is requested via the native layer 218, thereby forming the setting screen 1301 based on the information obtained from the printer information by using the above native function. Note that the HTML can be formed either in the script layer 217 or in the native layer 218.

Furthermore, each setting item such as the paper size shown in FIG. 13 is provided as a pull-down menu, and each item can be selected by a user operation. The setting screen 1301 indicates a state in which a list of selectable items is displayed as a setting item of a paper size by a pull-down menu, and a paper size such as A4 or A5 can be selected by a user operation.

In step S809, upon detecting a user operation on the setting completion button 1302, the CPU 100 creates setting information including a setting item selected by the user operation and transmits the setting information to the native layer 218. In the above example of the HTML description, SetPrint( ) is also a native function having the binding function. In the above example, SetPrint( ) is used to transfer the paper size, paper type, print quality, and bordered/borderless settings as a character string to the native layer 218.

In step S810, the CPU 100 receives the setting information from the script layer 217 by the binding function. In the native layer 218, a print command is generated later based on the received setting information, print target image data, and the image data of the stamp according to the communication protocol of the printer 112. The print command is transmitted to the printer 112 via the printer communication unit 213.

<Details of Rendering Processing>

When the user presses the setting completion button 1302 of the setting screen 1301 shown in FIG. 13, rendering processing in step S27 of FIG. 3 starts. Details of the rendering processing in step S27 of FIG. 3 will be described with reference to FIG. 10. Note that steps S901, S903, S905, S908, S909, S912 and S914 are processes executed by the CPU 100 using the program of the script layer 217, steps S902, S904, S906, S907, S910, S911 and S913 are processes executed by the CPU 100 using the program of the OS layer 219, and steps S915 to S917 are processes executed by the CPU 100 using the program of the native layer 218.

In step S901, the CPU 100 requests the OS layer 219 to activate an indicator. In step S902, the CPU 100 displays, on the display 104, the indicator activated by the request.

In step S903, the CPU 100 determines an output size corresponding to the paper size set in the setting information generated in step S809, and calculates an output image drawing area. In step S904, the CPU 100 reserves the calculated output image drawing area in the RAM 102.

In step S905, the CPU 100 requests the OS layer 219 to draw a photo image. In step S906, the CPU 100 interprets the script of the request to draw the photo image, and renders the photo image. After that, in step S907, the CPU 100 reflects the rendered photo image on the drawing area reserved in step S904. The reflecting operation is equivalent to not displaying an image on the display 104 but making a change to the drawing area.

In step S908, the CPU 100 describes and sets, in a script, a change in rendering conditions by an object parameter before requesting to draw a stamp image. In step S909, the CPU 100 requests the OS layer 219 to draw the stamp image.

In step S910, the CPU 100 renders the stamp image under the rendering conditions. That is, rotation processing or resizing of the image is executed in the OS layer. After the end of rendering, in step S911, the CPU 100 reflects the rendered stamp image on the drawing area reserved in step S904.

In step S912, the CPU 100 requests the OS layer 219 to obtain output image data. In step S913, the CPU 100 converts the image data existing in the drawing area (RAM 102) into base64 data, and transmits it to the script layer 217.

In step S914, the CPU 100 transmits the base64 data received from the OS layer 219 to the native layer 218, and requests the native layer 218 to print the data.

In step S915, the CPU 100 decodes the base64 data received from the script layer 217. In step S916, the CPU 100 converts the base64 data into an RGB image. In step S917, the CPU 100 requests the OS layer 219 to stop the indicator.

In step S918, the CPU 100 stops the indicator, and removes the indicator displayed on the display 104.

<Details of Print Processing>

Print processing is executed in step S28 of FIG. 3 using the rendered image data. In fact, the process of step S28 starts as soon as the process of step S918 of FIG. 10 ends. Details of the print processing in step S28 of FIG. 3 will be described with reference to FIG. 11. Note that the steps S1001 to S1003 shown in FIG. 11 are processes executed by the CPU using the program of the native layer 218, and the step S1004 are a process executed by the printer side.

In step S1001, based on the image information (RGB values) rendered in step S906, the CPU 100 converts the RGB values into a format usable by the printer 112. Formats usable by the printer include not only RGB, JPEG, and CMYK but also an original format of a printer vendor such as PDF. Any of these formats can be used here.

In step S1002, the CPU 100 generates a command to be transmitted to the printer 112 based on the setting information and the image data converted in step S1001. In step S1003, the CPU 100 uses the printer communication unit 213 to transmit the command generated in step S1002 to the printer 112 corresponding to the IP address stored in step S804 in accordance with the communication protocol usable by the printer.

In step S1004, the printer 112 executes printing according to the command received from the information processing apparatus 115.

Hence, according to the above-described embodiment, image data exchange can be done between the script layer and the native layer in the hybrid application. Many OSs have an interpretable function for JavaScript® as standard. Hence, an application that operates on many OSs can be provided to the user by one-time development not conscious of the difference in the native language. In addition, a native function having a high execution speed can be used, and usability improves. Furthermore, since the native function can be implemented without communication with an external server, an offline operation is possible.

In this embodiment, upon performing image data exchange between the script layer and the native layer, conversion steps of converting the image data into that of respective layer's formats are provided. As a result, even though high resolution image data for printing is to be processed, high speed image processing is performed in the native layer, and the script layer can display the result of the image processing.

In this embodiment, the native layer obtains paper information held by the printer, the native layer transfers the information to the script layer, and a UI display using the result is performed. Thus, even though a hybrid application is executed, a paper usable in the printer is exactly displayed on the UI. Therefore, a user can select his/her intended paper.

In this embodiment, mechanism in which print information set by a user is transferred from the script layer to the printer via the native layer. Thus, it is possible for a user to use various printing functions in the printer upon executing a hybrid application.

[Second Embodiment]

An example in which data exchange between the script layer and the native layer is directly performed using base64 will be described. Steps shown in FIG. 3 are implemented as in the first embodiment, and many portions are the same as in the first embodiment. For the sake of simplicity, a description of processes common to the first embodiment will be omitted here, and only portions characteristic to this embodiment will be explained.

Figure 16:
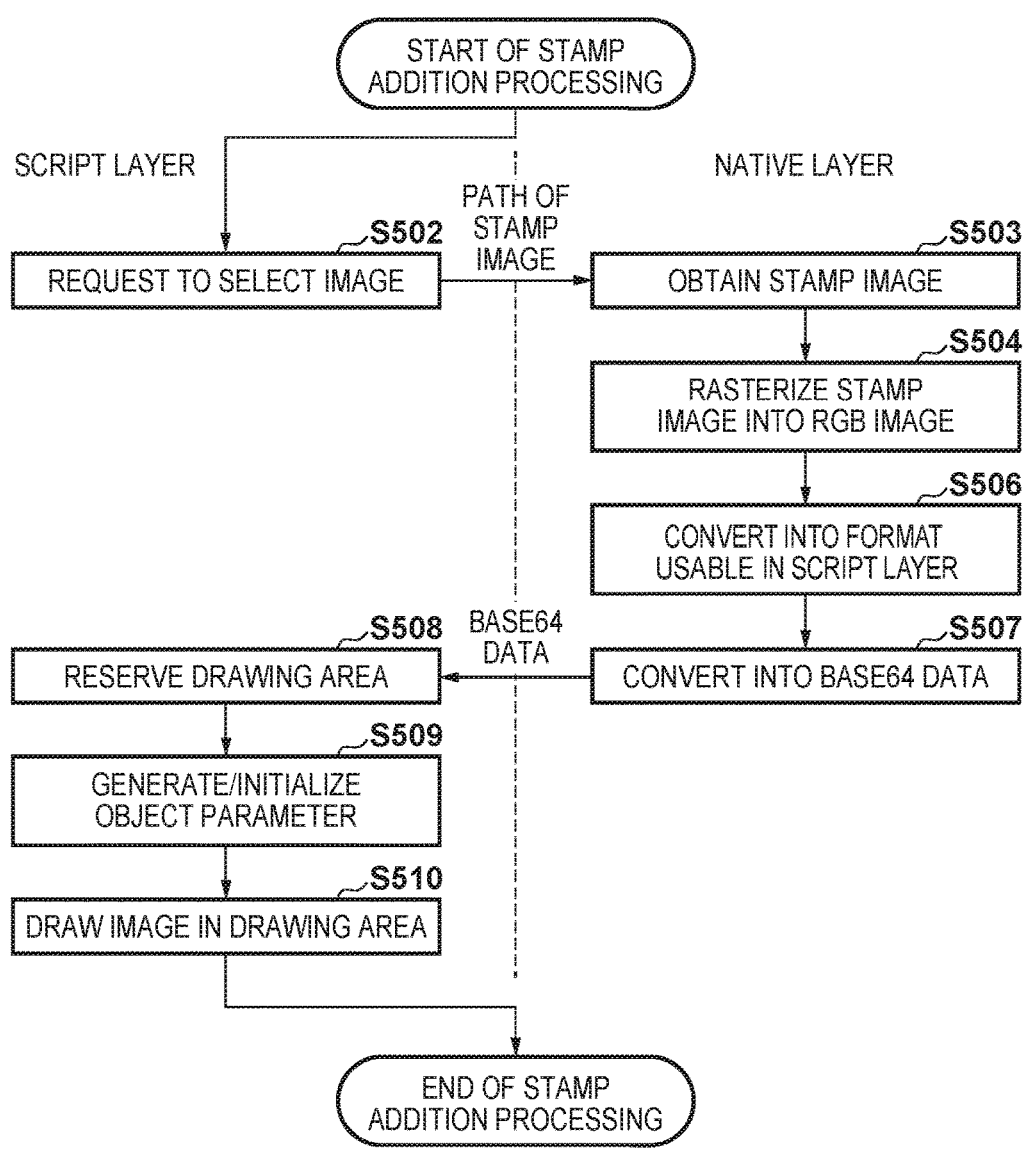
FIG. 16 is a flowchart illustrating stamp addition processing according to the second embodiment.

In the overview shown in FIG. 3, photo image selection processing in step S21, image processing in step S22, and stamp addition processing in step S23 are different from the first embodiment. Detailed steps corresponding to these processes will be described with reference to the flowcharts of FIGS. 14 to 16. In these flowcharts, the same step numbers as described in the first embodiment denote the same processing steps, and a description thereof will be omitted.

<Photo Image Selection Processing (FIG. 14)>

Figure 4:
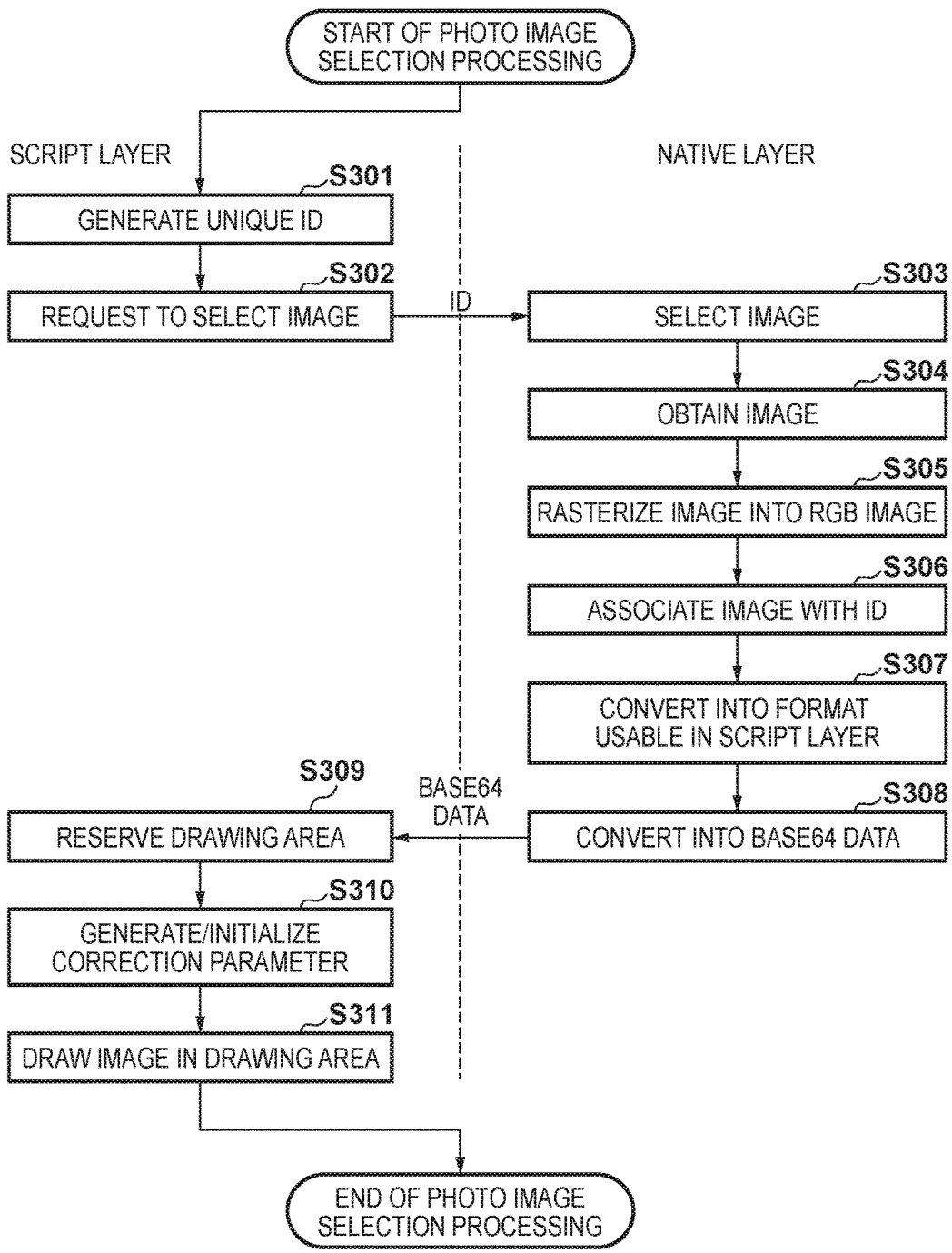
FIG. 4 is a flowchart illustrating details of photo image selection processing according to a first embodiment.

Photo image selection processing is almost the same as that shown in FIG. 4.

Figure 14:
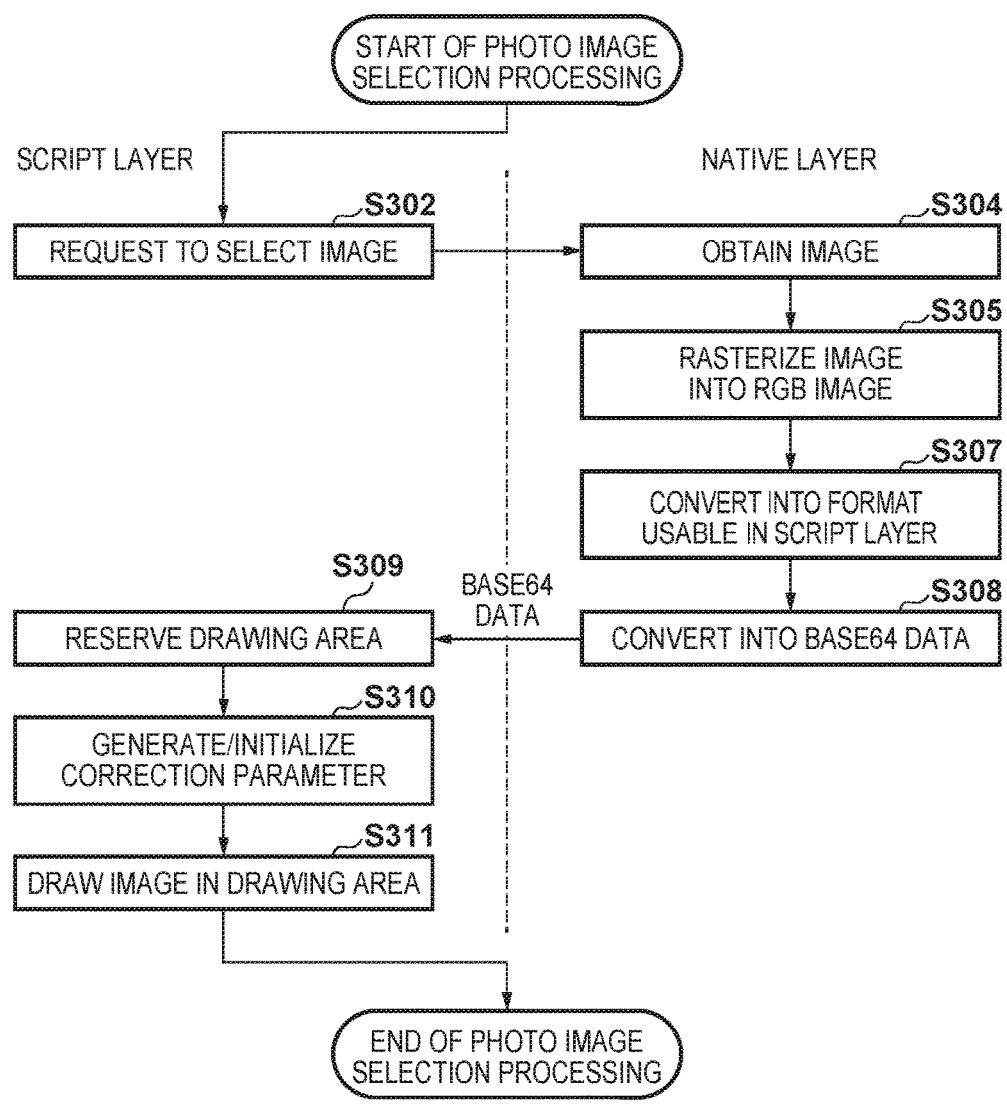
FIG. 14 is a flowchart illustrating photo selection processing according to a second embodiment.

As is apparent from comparison of FIGS. 4 and 14, in this embodiment, the native layer 218 directly returns data to the script layer 217. Hence, in the processing shown in FIG. 14, it is unnecessary to generate a unique ID in the script layer 217 or associate an ID with image data in the native layer. That is, steps S301, S303, and S306 are omitted in FIG. 14, as compared to FIG. 4.

<Image Processing (FIG. 15)>

Image processing is almost the same as that shown in FIG. 5.

As is apparent from comparison of FIGS. 5 and 15, in this embodiment, not only a correction parameter but also an image to be processed is converted into a format directly usable in the native layer and transferred in step S403A of the script layer 217 according to FIG. 15. On the other hand, in the native layer 218, data having the base64 format is converted into an RGB image to handle the transmitted image in step S404A. In this case as well, it is unnecessary to associate an ID with image data in the native layer 218. Hence, step S405 is unnecessary. Steps from step S406 (image processing according to the correction parameter) are the same as those described with reference to FIG. 5.

<Stamp Addition Processing (FIG. 16)>

Figure 6:
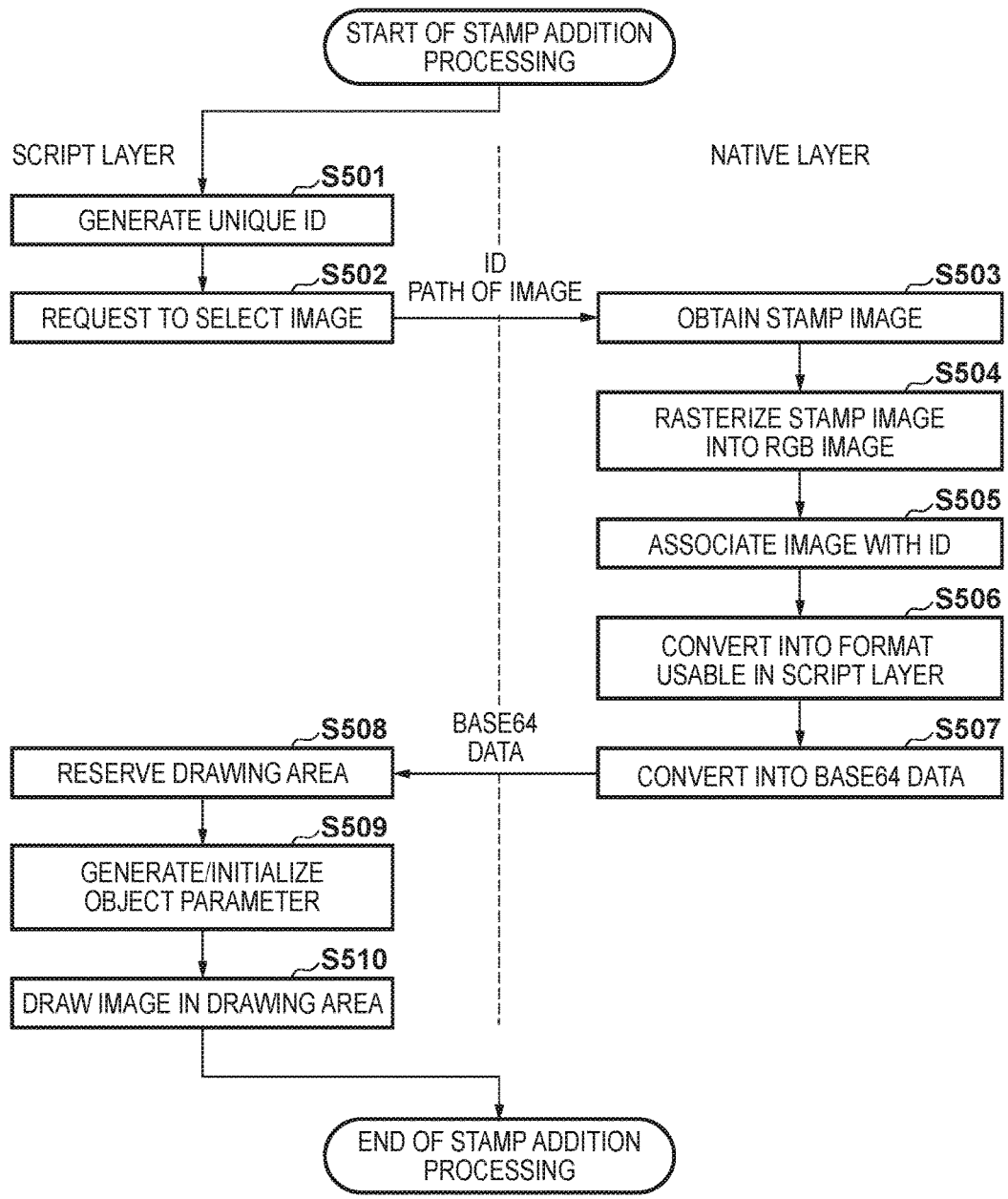
FIG. 6 is a flowchart illustrating details of stamp addition processing according to the first embodiment.

Stamp addition processing is almost the same as that shown in FIG. 6. In this processing, the native layer 218 directly returns data to the script layer 217, as described concerning photo image selection processing. Hence, in the processing shown in FIG. 16, it is unnecessary to generate a unique ID in the script layer 217 or associate an ID with image data in the native layer. That is, steps S501 and S505 are omitted in FIG. 16, as compared to FIG. 6. As a characteristic feature in FIG. 16, image obtaining in step S503 is done by designating an absolute path.

The overall procedure of processing according to the second embodiment is the same as that of the first embodiment, and a description of image processing in the script layer (and the OS layer) will be omitted. If image processing is performed in the script layer (and the OS layer), it can be implemented in accordance with the following procedure.

That is, a Context object is obtained from the Canvas of a photo image, and an image data object is obtained using the getImageData method of the Context object. After that, an operation of obtaining RGBA data in the obtained image data object is added. The RGBA data after the change is reflected on the Canvas using the putImageData method of the Context object.

In accordance with the above-described procedure, image processing can be performed in a layer other than the native layer.

Hence, according to the above-described embodiment, an image to be handled is directly exchanged between the script layer and the native layer, thereby implementing image processing in both the script layer and the native layer, unlike the first embodiment.

[Third Embodiment]

An example in which image data is not continuously held in a RAM 102 but saved in a secondary storage device 103 as a temporary file when it is not used will be described.

In this embodiment, steps shown in FIG. 3 are implemented as in the first embodiment, and many potions are the same as in the first embodiment. For the sake of simplicity, a description of processes common to the first embodiment will be omitted here, and only portions characteristic to this embodiment will be explained.

In the overview shown in FIG. 3, photo image selection processing in step S21, image processing in step S22, and stamp addition processing in step S23 are different from the first embodiment. Detailed steps corresponding to these processes will be described with reference to the flowcharts of FIGS. 17 to 19. In these flowcharts, the same step numbers as described in the first embodiment denote the same processing steps, and a description thereof will be omitted.

<Photo Image Selection Processing (FIG. 17)>

Photo image selection processing is almost the same as that shown in FIG. 4.

Figure 17:
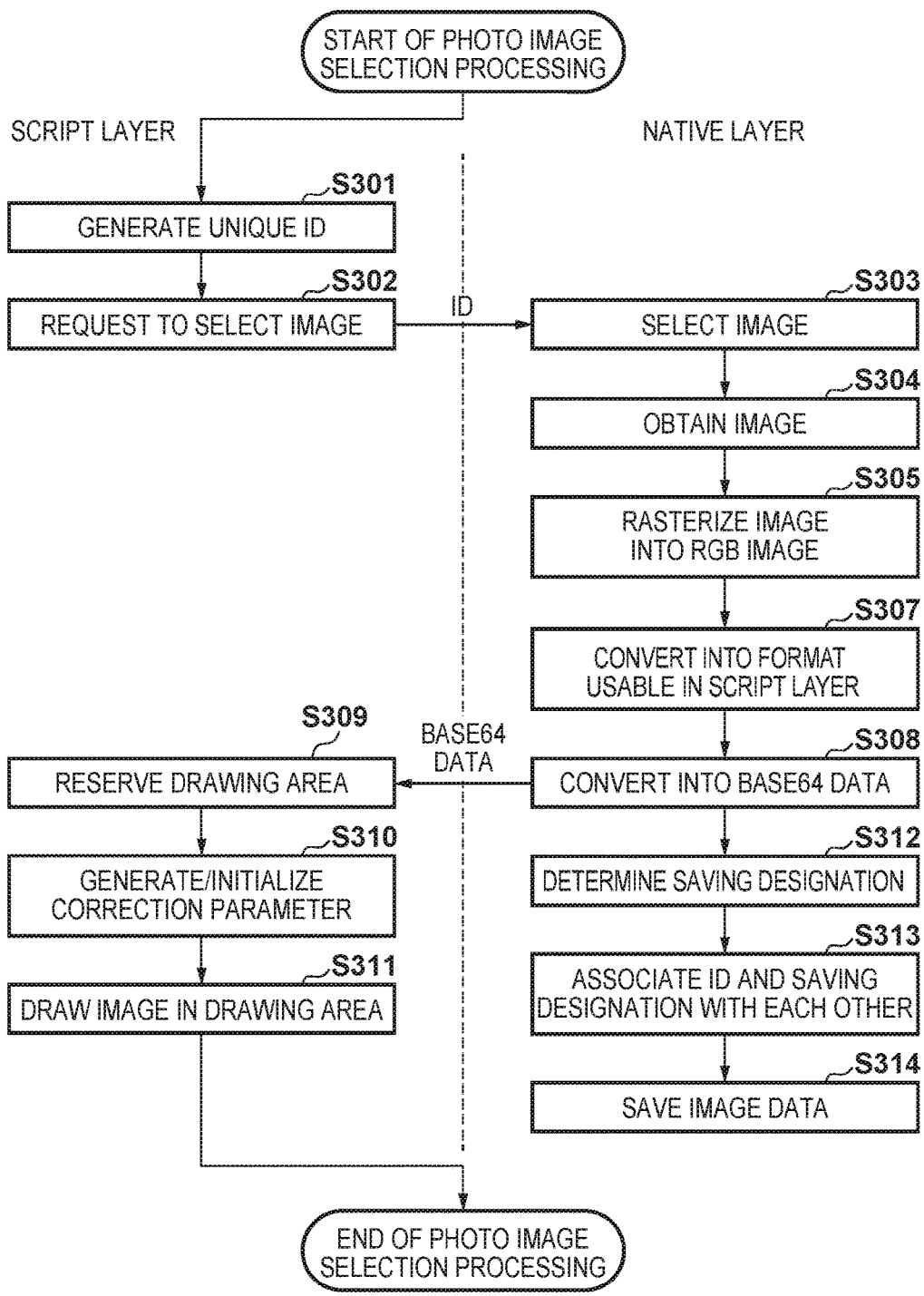
FIG. 17 is a flowchart illustrating photo selection processing according to a third embodiment.

As is apparent from comparison of FIGS. 4 and 17, in this embodiment, the photo image selection processing is almost the same as in the first embodiment. As a characteristic feature of this embodiment, after obtained data is returned to the script layer 217, the image is not continuously held in the native layer 218 but temporarily saved in the local memory. That is, in FIG. 17, a saving destination is determined in step S312. In step S313, the current time is used as an ID and associated with the saving destination. In step S314, the image data is saved in the secondary storage device 103.

Note that any method is usable in step S313 if a unique ID can be generated. In step S314, any data format is usable as the image data saving format, and the image data can be saved either as bitmap data of RGB data or as JPEG data.

<Image Processing (FIG. 18)>

Image processing is almost the same as that shown in FIG. 5.

Figure 18:
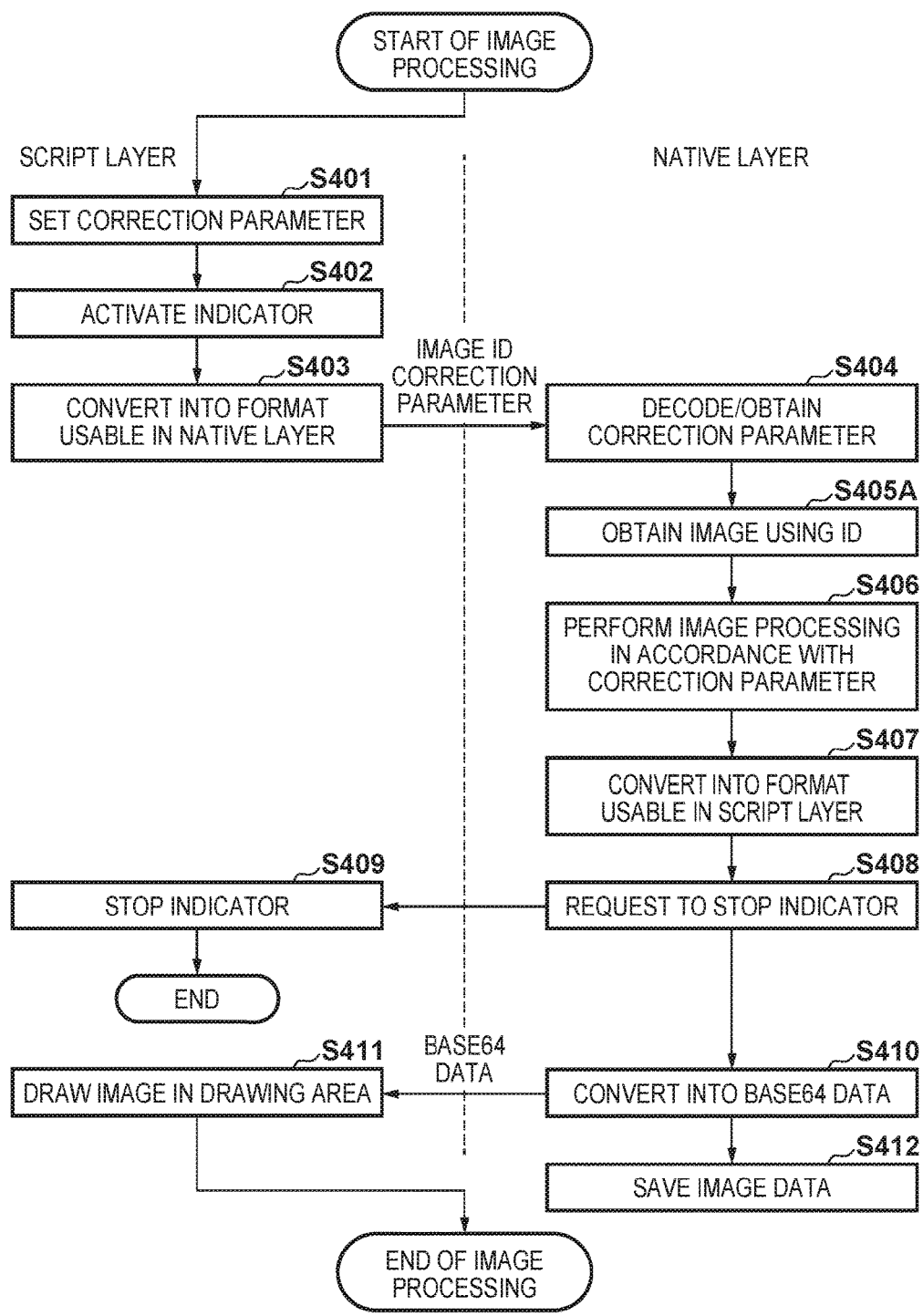
FIG. 18 is a flowchart illustrating image processing according to the third embodiment.
Figure 19:
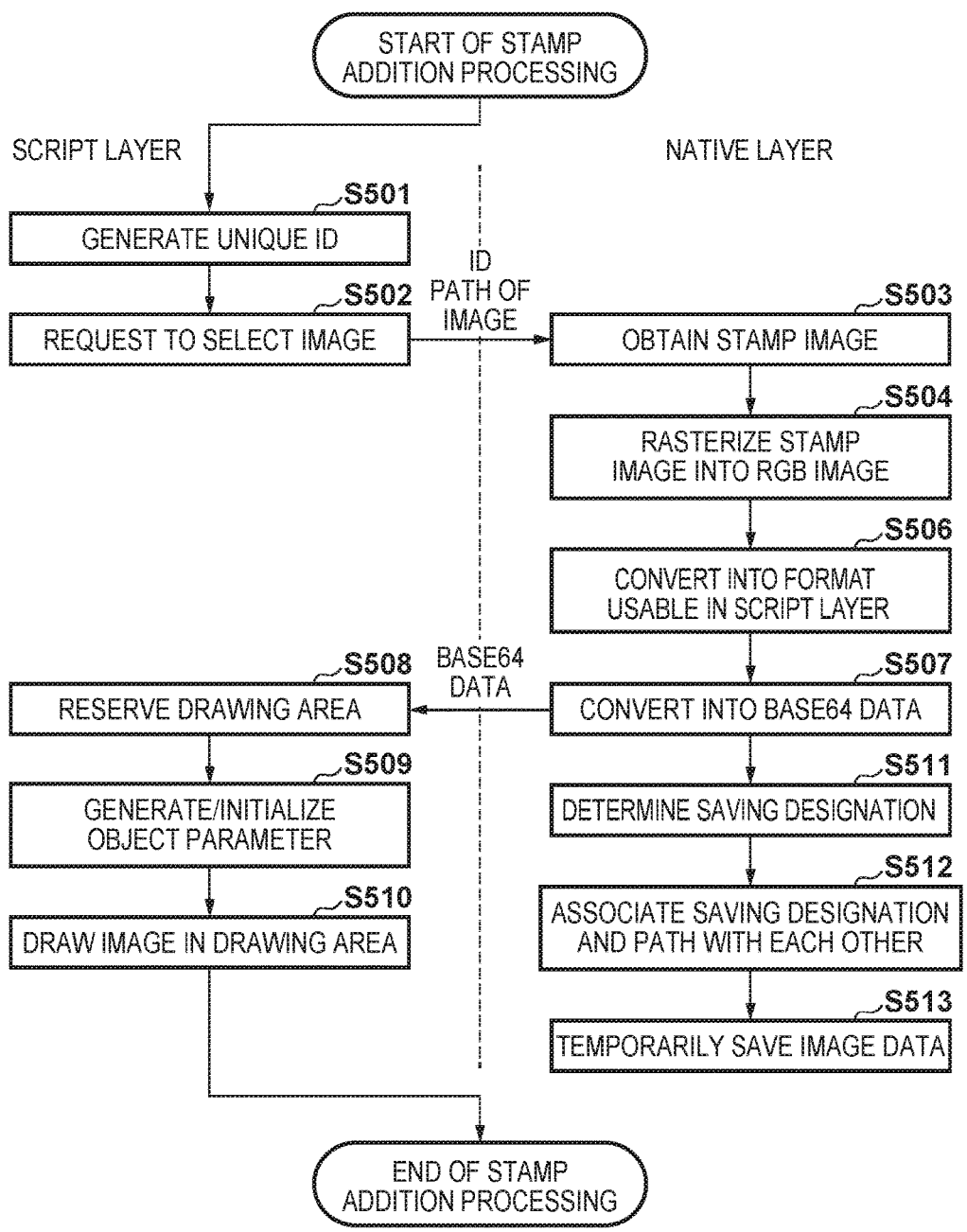
FIG. 19 is a flowchart illustrating stamp addition processing according to the third embodiment.

As is apparent from comparison of FIGS. 5 and 18, there are two different points. In this embodiment, the image is not held in the native layer. Hence, according to FIG. 18, the processing target image is obtained from a path associated with the ID in step S405A. In addition, after the processed data is transmitted to the script layer 217, the image data is saved again in step S412. At this time, in the native layer 218, the image is saved in the same path as that upon obtaining. The image data is thus updated (overwritten).

<Stamp Addition Processing (FIG. 19)>

Stamp addition processing is almost the same as that shown in FIG. 6. That is, in FIG. 19, step S505 is omitted, as compared to FIG. 6. As a characteristic feature in FIG. 19, image obtaining in step S503 is done by designating an absolute path. Additionally, in FIG. 19, a saving designation is determined in step S511. In step S512, the saving designation and the path are associated with each other. In step S513, the image data is saved in the secondary storage device 103.

In this example, after image processing, the information is updated (overwritten). If another ID is added to the old image, a result halfway through the image processing can be saved. An UNDO function can be implemented using this.

Hence, according to the above-described embodiment, image data not to be used is temporarily saved as a temporary file and rasterized on the RAM only when necessary. This can reduce the frequency or probability of memory shortage in the RAM.

[Fourth Embodiment]

An example in which an image is not operated without changing the size in obtaining the image but handled as a reduced image in accordance with a display UI will be described.

In this embodiment, steps shown in FIG. 3 are implemented as in the first embodiment, and many potions are the same as in the first embodiment. For the sake of simplicity, a description of processes common to the first embodiment will be omitted here, and only portions characteristic to this embodiment will be explained.

In the overview shown in FIG. 3, photo image selection processing in step S21, image processing in step S22, stamp addition processing in step S23, and rendering processing in step S27 are different from the first embodiment. Detailed steps corresponding to these processes will be described with reference to the flowcharts of FIGS. 20 to 23B. In these flowcharts, the same step numbers as described in the first embodiment denote the same processing steps, and a description thereof will be omitted.

<Photo Image Selection Processing (FIG. 20)>

Photo image selection processing is almost the same as that shown in FIG. 4.

As is apparent from comparison of FIGS. 4 and 20, this embodiment is different from the first embodiment in the following points. That is, in processing shown in FIG. 20, after image obtaining, the path and the ID of the image are associated with each other in step S304'. After the image is rasterized into RGB data, the obtained image is temporarily resized in step S305' to handle a reduced image. In step S306A, the resized image is associated with an ID.

At the time of rendering, not the resized image but the originally selected image is used. Hence, the originally selected image is stored by associating the image path and the ID with each other in step S304' so as to be referred to later.

Note that as for the size of the image to be returned in step S302, the script layer 217 designates a size as needed.

<Image Processing (FIG. 21)>

Image processing is almost the same as that shown in FIG. 5.

Figure 21:
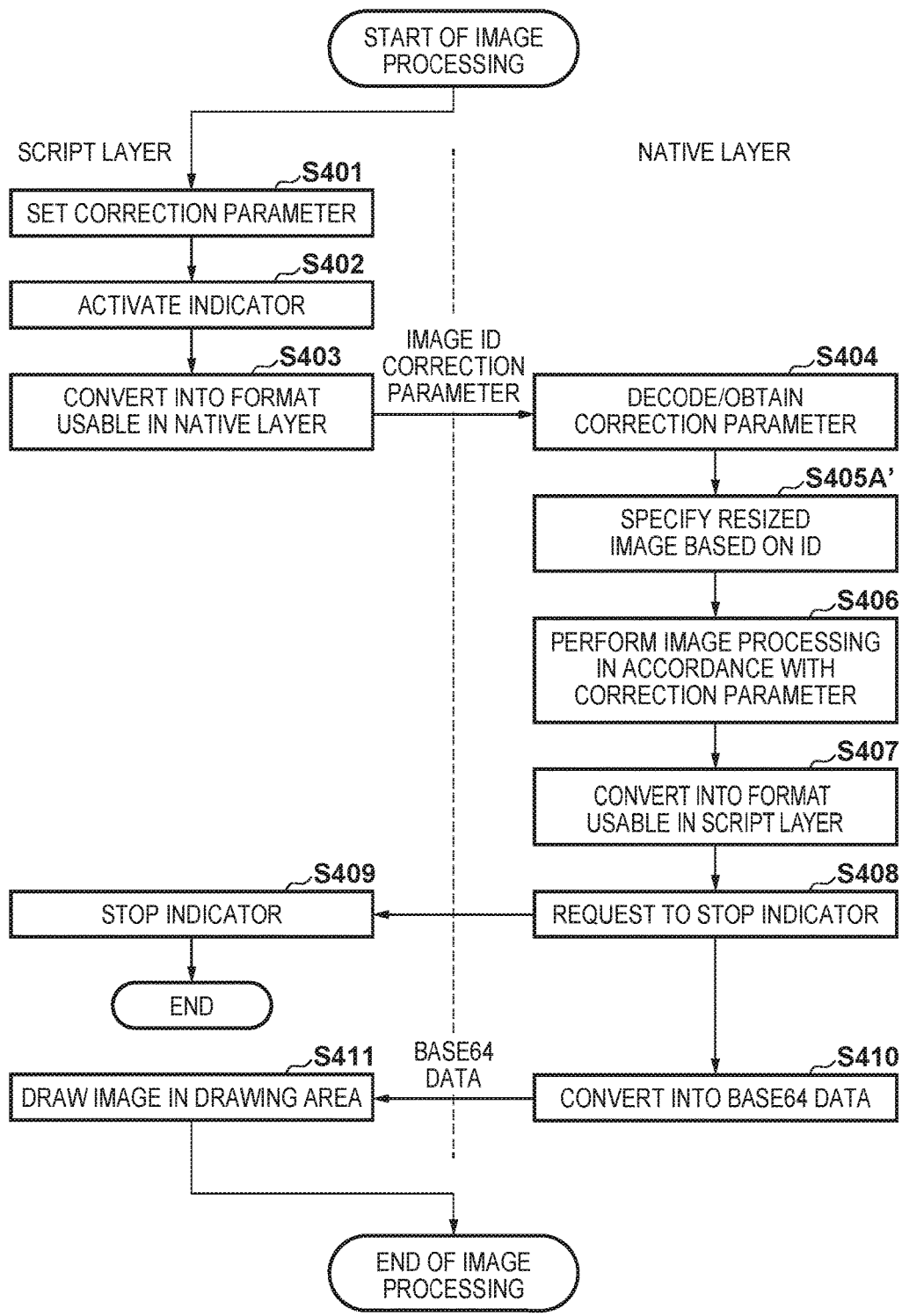
FIG. 21 is a flowchart illustrating image processing according to the fourth embodiment.

As is apparent from comparison of FIGS. 5 and 21, the only difference is specifying the resized image based on the ID in step S405A'.

<Stamp Addition Processing (FIG. 22)>

From the viewpoint of processing procedure, stamp addition processing is almost the same as that shown in 20.

Figure 20:
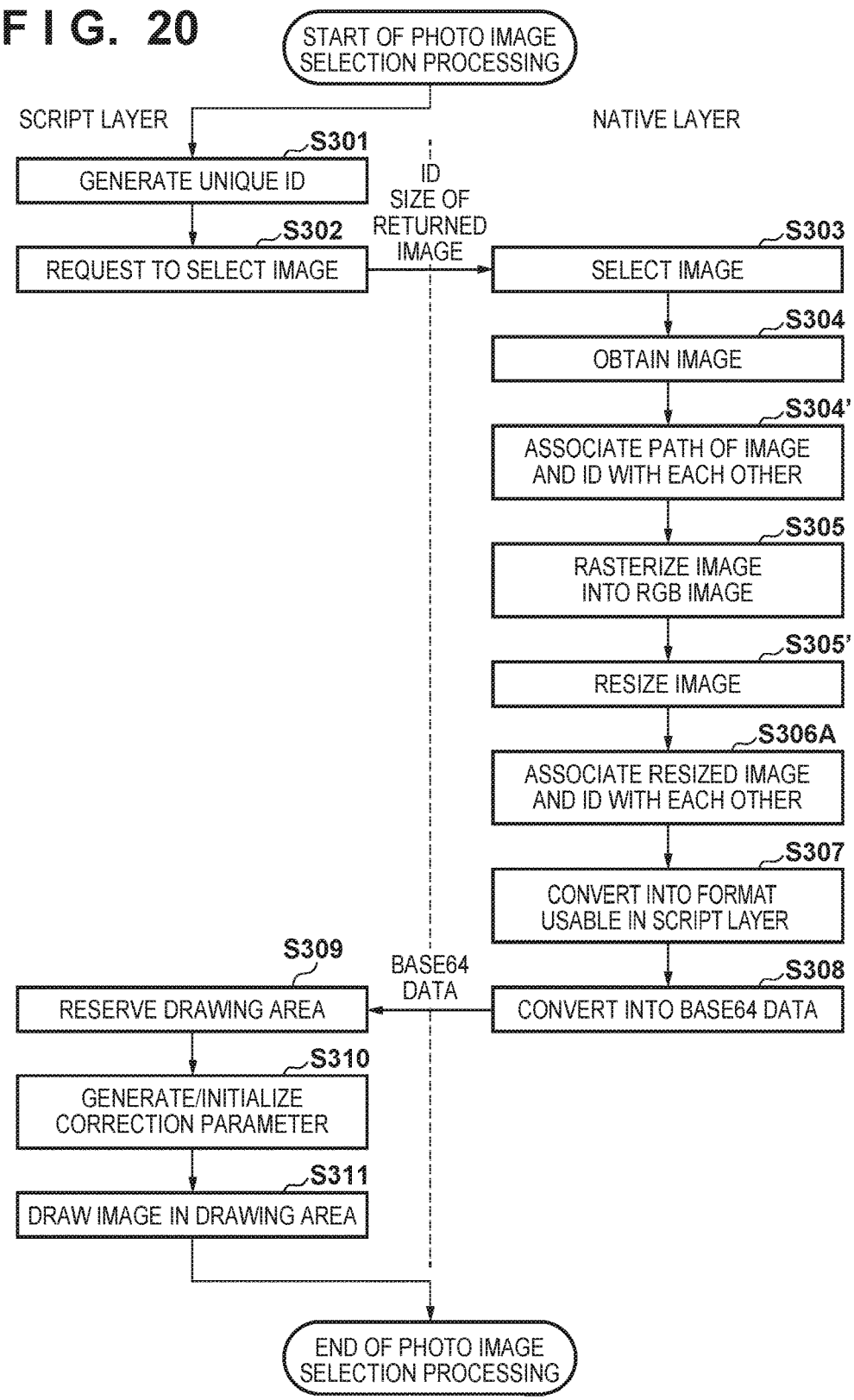
FIG. 20 is a flowchart illustrating photo selection processing according to a fourth embodiment.
Figure 22:
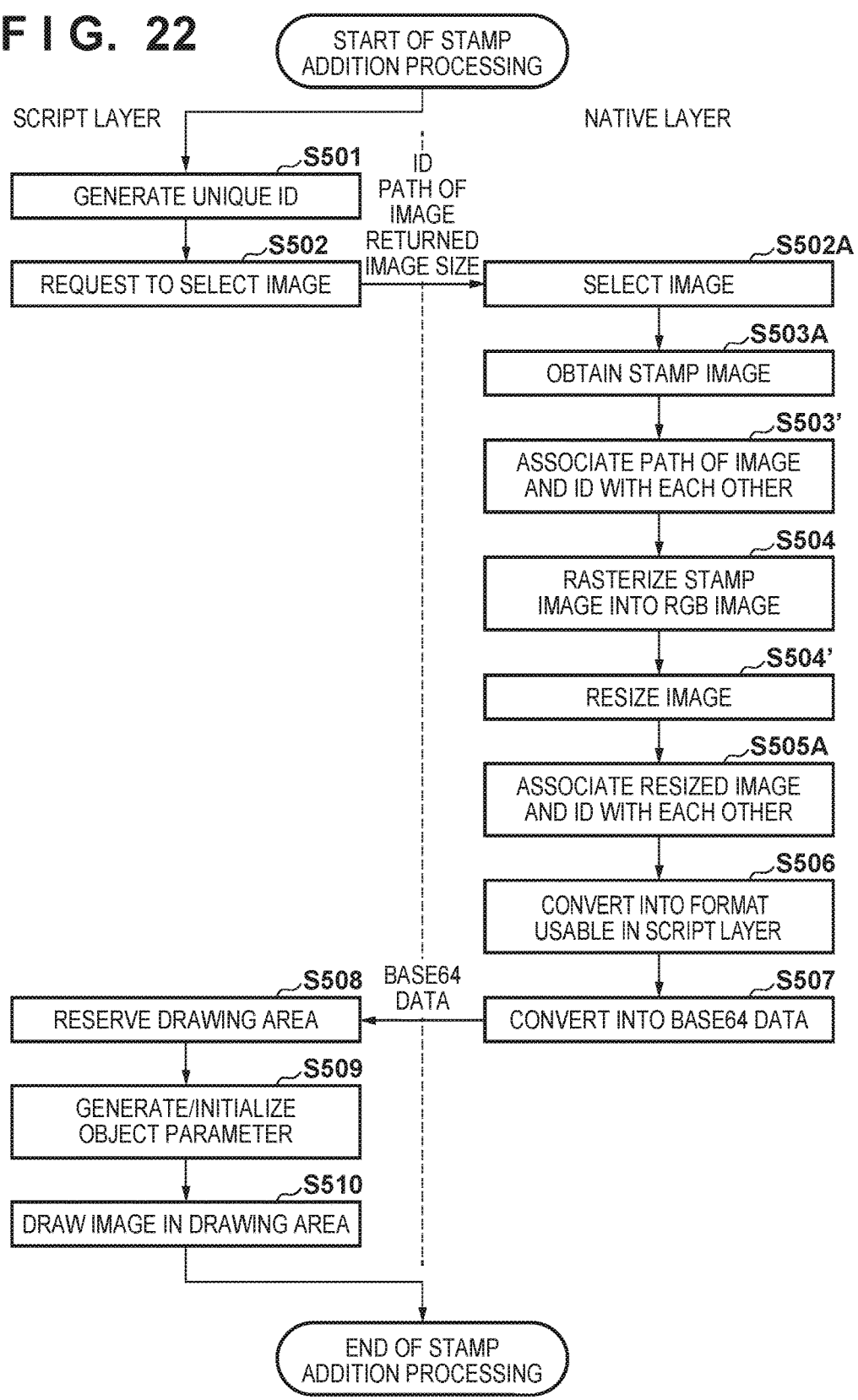
FIG. 22 is a flowchart illustrating stamp addition processing according to the fourth embodiment.

As is apparent from comparison of FIGS. 22 and 20, the only difference is obtaining the image by designating an absolute path in step S503A of FIG. 22.

Note that as can be seen from comparison of FIGS. 22 and 6, this embodiment is different from the first embodiment in the following points. That is, in processing shown in FIG. 22, an image is selected using the designated absolute path in step S502A. In step S503A, the image is obtained. In step S504', the path of the image and the ID are associated with each other. In step S504', the image is temporarily resized. In step S505A, the resized image is associated with an ID.

<Rendering (FIGS. 23A and 23B)>

In this embodiment, since image processing is executed for a resized image, the originally selected image does not undergo any processing. Hence, the same processing as that of the resized image needs to be applied to the originally selected image as well.

Figure 10:
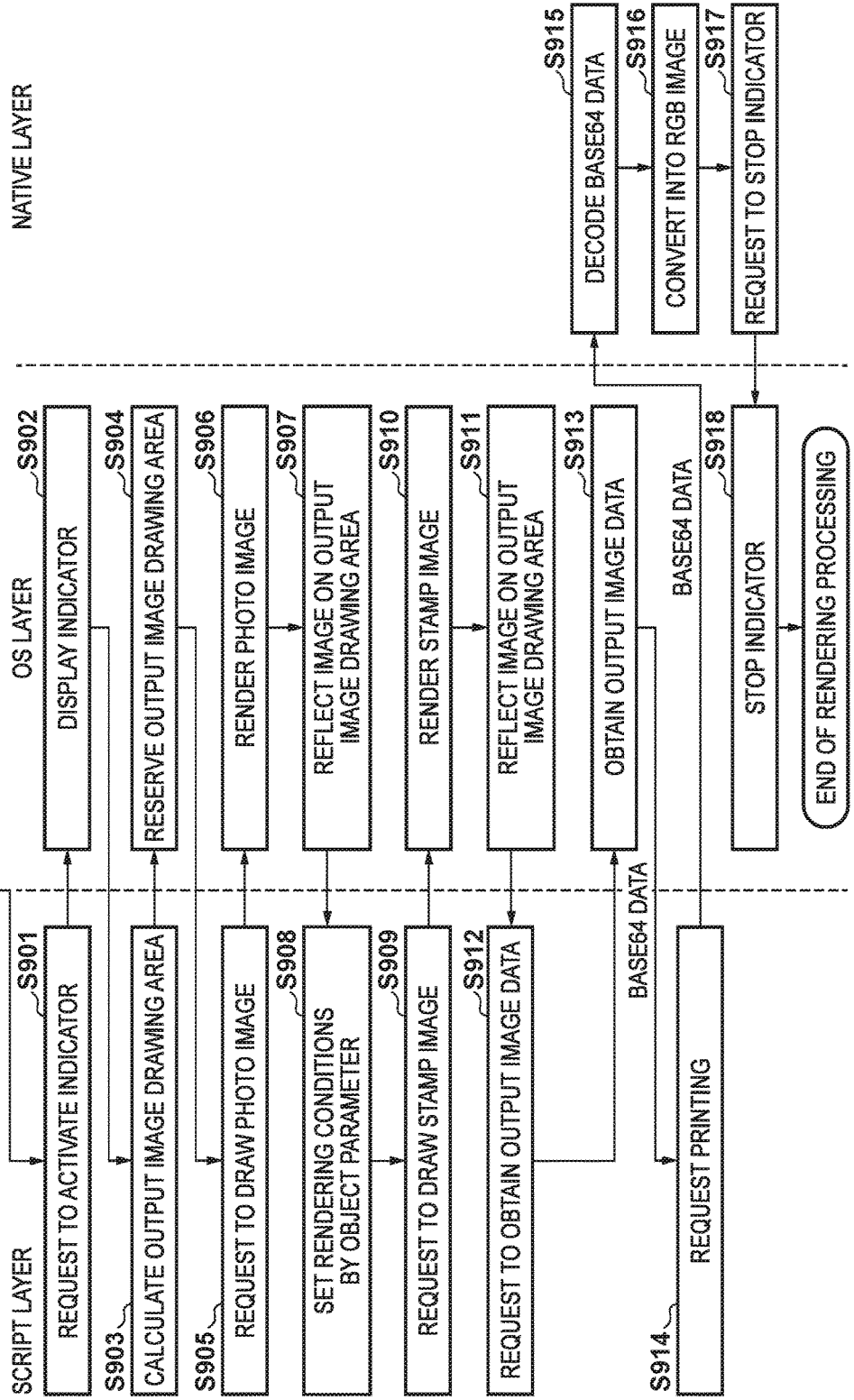
FIG. 10 is a flowchart illustrating details of rendering processing.
Figure 11:
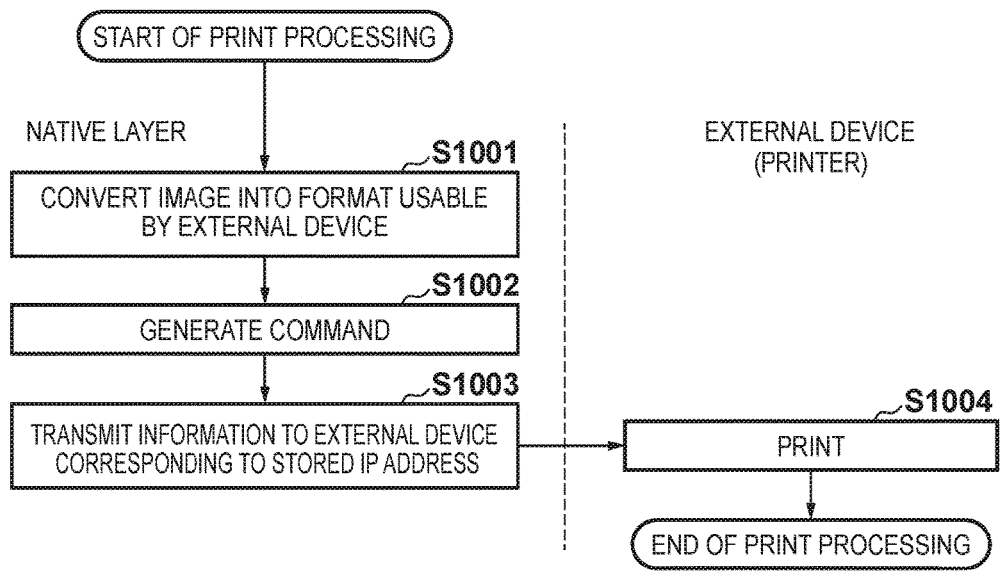
FIG. 11 is a flowchart illustrating details of print processing.
Figure 23A:
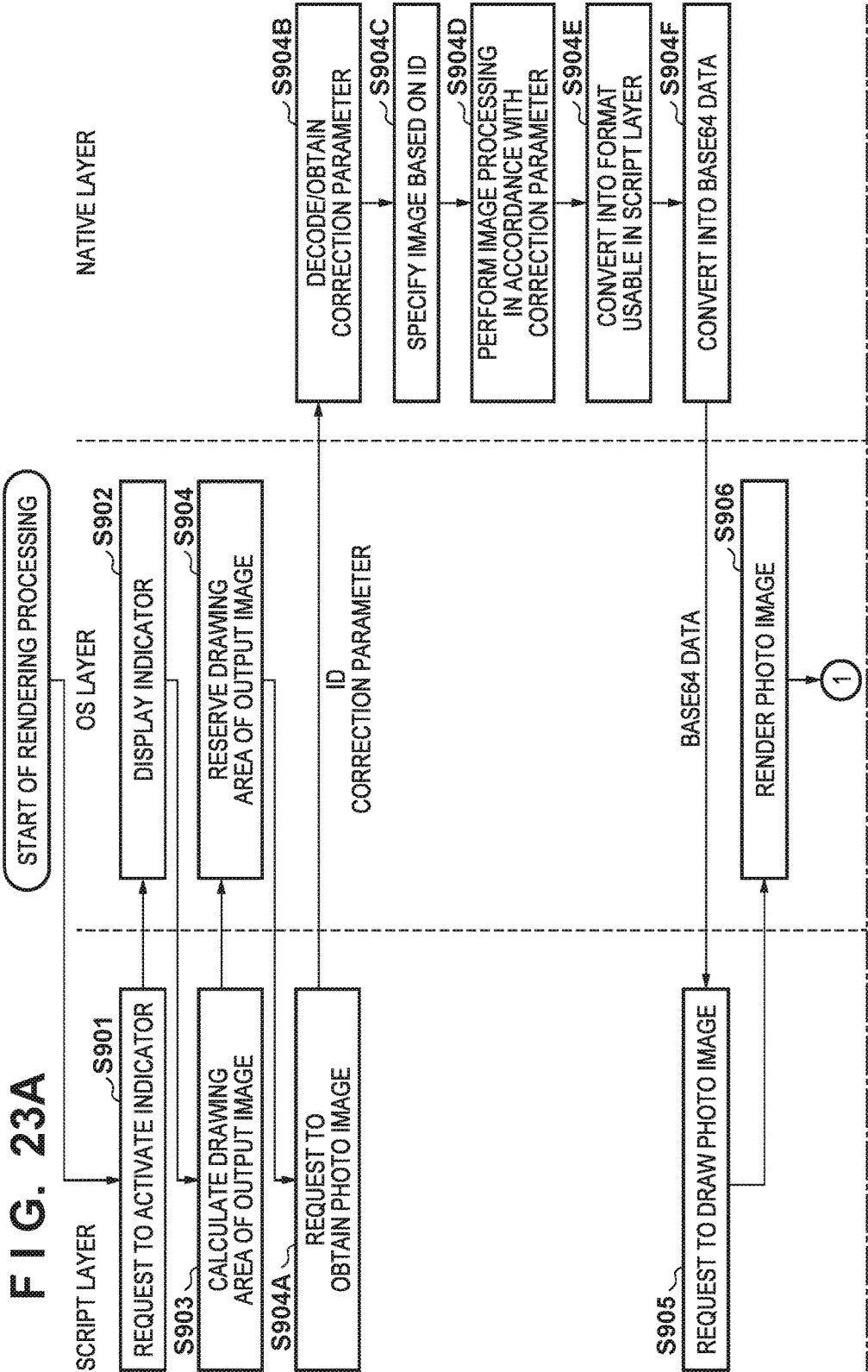
FIGS. 23A and 23B are flowcharts illustrating rendering processing according to the fourth embodiment.
Figure 23B:
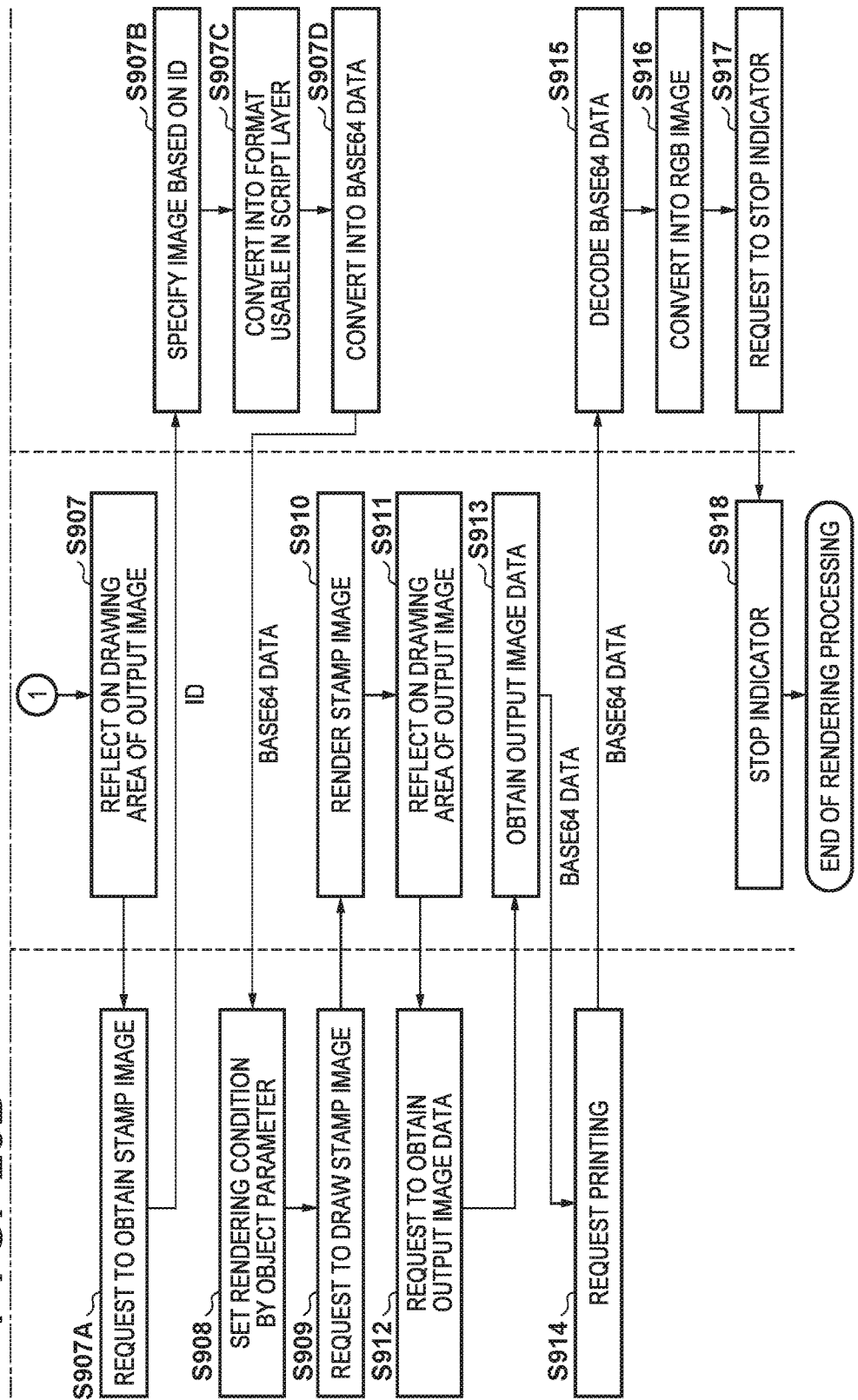

Hence, in the flowchart of FIGS. 23A and 23B, the following processed are added as compared to FIG. 10.

In step S904A, in the script layer 217, the CPU 100 requests to obtain a photo image. At this time, not only an ID to specify an image but also a correction parameter is transmitted to the native layer 218. Responding to this, in the native layer 218, the CPU 100 decodes the received correction parameter in step S904B. In step S904C, the CPU 100 specifies the image based on the path associated with the ID and obtains the original image. In step S904D, in the native layer 218, the CPU 100 applies image processing to the obtained original image based on the information of the decoded correction parameter. In step S904E, the CPU 100 converts the data into data in a format interpretable in the script layer 217. In step S904F, the CPU 100 transmits base64 data to the script layer 217.

No image processing is applied to the stamp image. However, since the original image needs to be obtained, in the script layer 217, the CPU 100 requests the native layer 218 to obtain the stamp image in step S907A. Responding to this, in the native layer 218, the CPU 100 specifies the image based on the ID in step S907B. In step S907C, the CPU 100 converts the data into data in a format interpretable in the script layer 217. In step S907D, the CPU 100 transmits base64 data to the script layer 217.

The subsequent processing is the same as that described with reference to FIG. 10.

Hence, according to the above-described embodiment, the processing time can be shortened by operating an image of a reduced size. This can improve the usability.

Still Another Embodiment

The example of the information processing apparatus shown in FIG. 1 is hardware assuming a portable mobile computer. However, the present invention is not limited to this. For example, the same arrangement as described above can be implemented on hardware such as a desktop type personal computer or game machine.

Additionally, in the above embodiments, an example in which the stamp image is obtained from the native layer has been described. However, the present invention is not limited to this. For example, the script layer can create content by itself using the Context function of Canvas.

Furthermore, in the above embodiments, the Canvas function of JavaScript® has been exemplified as drawing of a content (photo image or stamp image). However, drawing of a content is not limited to this. For example, a content can also be drawn using SVG (Scalable Vector Graphics).

In addition, in the above embodiments, an example in which one image is selected from an image folder in the device has been described. However, the present invention is not limited to this. For example, an image may be selected by designating the absolute path of the data, designating a whole folder including the image, or shooting an image on the spot using the camera function of the device. As for the data obtaining destination, for example, an image on the Internet is selected, an image in a detachable storage medium is selected, or an image is obtained by communication with an external device. Examples of the external device are a PC, portable information terminal, and camera.

The pieces of information as described above may be held in the application in advance, or included in the printer main body and obtained by a "GetInformation" command. Alternatively, the information may be held in the server 114 as shown in FIG. 1, and the information as described above may be obtained from the server in accordance with the standard communication protocol of the web.

In addition, as the printer according to each of the aforementioned embodiments, an inkjet printer, a laser printer, a dye-sublimation printer, a dot impact printer, or the like can be used. These printers may be so-called multi-function peripherals having not a single function but the printer function, the scanner function, and the like.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2014-122749, filed Jun. 13, 2014, and 2015-110261, filed May 29, 2015, which are hereby incorporated by reference herein in their entirety.

What is claimed is:

1. A method of controlling an information processing apparatus for executing a program including a first program layer, described by an OS-independent program language, and a second program layer, described by an OS-dependent program language, wherein the first program layer uses image data of a first format, the second program layer uses image data of a second format different from the first format, and both the first and second program layers are executed in the information processing apparatus, the method comprising:

causing the first program layer to transmit a selection instruction of image data to the second program layer;
 causing the second program layer to convert the image data of the second format, which is selected based on the selection instruction transmitted from the first program layer, into image data of the first format;
 causing the second program layer to transmit the image data of the first format to the first program layer, wherein the image data of the first format to be transmitted to the first program layer is reduced in size for display;
 causing the first program layer to draw an image based on the transmitted image data of the first format which was reduced in size for display, using the OS-independent language; and
 accepting a print command using a display screen displayed by the first program layer after drawing the image based on the image data of the first format using the OS-independent language.

2. The method according to claim 1, further comprising:
 inputting, from a user, an instruction of image processing for the image data; and
 performing image processing based on the inputted instruction of image processing.

3. The method according to claim 2, wherein the inputted instruction of image processing includes an instruction to correct or process a value of each pixel of the image data, and
 at the image processing, image processing of correcting or processing the value of each pixel of the image data is executed based on the inputted instruction of image processing.

4. The method according to claim 1, wherein the image based on the image data of the first format is drawn using Canvas.

5. The method according to claim 1, wherein the image based on the image data of the first format is drawn using Scalable Vector Graphics.

6. The method according to claim 1, wherein the OS-independent program language is JavaScript®, and
 the OS-dependent program language is one of C, C++ and Java®.

7. The method according to claim 1, wherein the image data of the first format is image data of a text format, and the image data of the second format is image data of a binary format.

8. The method according to claim 1, wherein the first program layer transmits parameter information used for performing image processing from the first program layer to the second program layer, the second program layer performs the image processing based on the parameter information, the first program layer displays an indicator related to the image processing on a screen based on information transmitted from the second program layer performing the image processing.

9. A non-transitory computer readable storage medium storing a computer program to be executed in one or more processors of an information processing apparatus, the program comprising:

a first program layer described by an OS-independent program language; and a second program layer described by an OS-dependent program language, wherein the first program layer uses image data of a first format, the second program layer uses image data of a second format different from the first format, both the first and second program layers are executed in the one or more processors, the first program layer transmits a selection instruction of image data to the second program layer, the second program layer converts the image data of the second format, which is selected based on the selection instruction transmitted from the first program layer, into image data of the first format, and transmits the image data of the first format to the first program layer, wherein the image data of the first format to be transmitted to the first program layer is reduced in size for display, the first program layer draws an image based on the transmitted image data of the first format which was reduced in size for display, using the OS-independent language; and a print command is accepted using a display screen displayed by the first program layer after drawing the image based on the image data of the first format using the OS-independent language.

10. An information processing apparatus comprising:
one or more processors; and
memory storing a program to be executed by the one or more processors, the program including a first program layer, described by an OS-independent program language, and a second program layer, described by an OS-dependent program language,
wherein the first program layer uses image data of a first format, the second program layer uses image data of a second format different from the first format, and both the first and second program layers are executed in the information processing apparatus, the one or more processor and memory function to:
transmit a selection instruction of image data to the second program layer;
convert the image data of the second format, which is selected based on the selection instruction transmitted from the first program layer, into image data of the first format;
transmit the image data of the first format from the second program layer to the first program layer, wherein the image data of the first format to be transmitted to the first program layer is reduced in size for display;
draw, in the first program layer, an image based on the transmitted image data of the first format which was reduced in size for display, using the OS-independent language; and
accept a print command using a display screen displayed by the first program layer after drawing the image based on the image data of the first format.

11. The apparatus according to claim 10, wherein the one or more processors and memory further function to:
input, from a user, an instruction of image processing for the image data; and perform image processing based on the inputted instruction of image processing.

12. The apparatus according to claim 11, wherein the inputted instruction of image processing includes an instruction to correct or process a value of each pixel of the image data, and
at the image processing, image processing of correcting or processing the value of each pixel of the image data is executed based on the inputted instruction of image processing.

13. The apparatus according to claim 10, wherein the image based on the image data of the first format is drawn using Canvas.

14. The apparatus according to claim 10, wherein the image based on the image data of the first format is drawn using Scalable Vector Graphics.

15. The apparatus according to claim 10, wherein the OS-independent program language is JavaScript®, and
the OS-dependent program language is one of C, C++ and Java®.

16. The apparatus according to claim 10, wherein the image data of the first format is image data of a text format, and the image data of the second format is image data of a binary format.

17. The apparatus according to claim 10, wherein the first program layer transmits parameter information used for performing image processing from the first program layer to the second program layer, the second program layer performs the image processing based on the parameter information, the first program layer displays an indicator related to the image processing on a screen based on information transmitted from the second program layer performing the image processing.

* * * * *